(12) United States Patent
Baginski et al.

(10) Patent No.: US 8,478,559 B2
(45) Date of Patent: Jul. 2, 2013

(54) SEMICONDUCTOR COMPONENT AND METHOD OF MAKING THE SAME

(75) Inventors: Patrick Baginski, Oelde (DE); Reinhold Bayerer, Warstein (DE); Holger Ruething, Munich (DE); Daniel Domes, Ruethen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/423,883

(22) Filed: Mar. 19, 2012

(65) Prior Publication Data

US 2012/0175780 A1 Jul. 12, 2012

Related U.S. Application Data

(62) Division of application No. 12/168,369, filed on Jul. 7, 2008, now Pat. No. 8,155,916.

(51) Int. Cl.
*G01K 1/28* (2006.01)
*G01K 1/26* (2006.01)
*G01K 7/21* (2006.01)

(52) U.S. Cl.
USPC .......................................................... 702/133

(58) Field of Classification Search
USPC .......................................................... 702/133
See application file for complete search history.

(56) References Cited

U.S. PATENT DOCUMENTS

| | | | |
|---|---|---|---|
| 5,726,474 A | 3/1998 | Miller et al. | |
| 6,835,994 B2 | 12/2004 | Kistner et al. | |
| 7,554,173 B2 | 6/2009 | Inaguchi et al. | |
| 7,715,160 B2 * | 5/2010 | Scheikl et al. | 361/86 |
| 2002/0135037 A1 | 9/2002 | Tomomatsu | |
| 2002/0167065 A1 | 11/2002 | Graf et al. | |
| 2005/0133855 A1 | 6/2005 | Graf | |
| 2005/0194635 A1 | 9/2005 | Pfirsch | |
| 2007/0176626 A1 * | 8/2007 | Bayerer et al. | 324/771 |
| 2010/0001785 A1 | 1/2010 | Baginski et al. | |

FOREIGN PATENT DOCUMENTS

| | | |
|---|---|---|
| DE | 10158496 | 12/2002 |
| DE | 10024516 | 3/2006 |
| EP | 0256715 | 2/1992 |
| EP | 0350015 | 9/1995 |
| EP | 0736907 | 12/1999 |
| EP | 1830405 | 9/2007 |
| JP | 2003133925 | 5/2003 |

OTHER PUBLICATIONS

Restriction Requirement for U.S. Appl. No. 12/168,369 mailed Nov. 10, 2010 (6 pages).

(Continued)

*Primary Examiner* — Aditya Bhat
(74) *Attorney, Agent, or Firm* — Dicke, Billig & Czaja, PLLC

(57) ABSTRACT

One embodiment provides a semiconductor chip including a semiconductor body and a power semiconductor component integrated therein. The power semiconductor component includes a load electrode zone arranged on a first surface of the semiconductor body, a control electrode zone arranged on the first surface, the control electrode zone being electrically insulated from the load electrode zone, and a resistance track arranged on the load electrode zone and the control electrode zone. The resistance track ensures an electrical connection between the load electrode zone and the control electrode zone.

8 Claims, 14 Drawing Sheets

OTHER PUBLICATIONS

Office Action for U.S. Appl. No. 12/168,369 mailed Feb. 22, 2011 (10 pages).

Final Office Action for U.S. Appl. No. 12/168,369 mailed Jun. 16, 2011 (9 pages).

Notice of Allowance for U.S. Appl. No. 12/168,369 mailed Dec. 12, 2011 (8 pages).

First Office Action for Chinese Patent Application No. 200910159335.7 issued Jan. 18, 2012 (3 pages).

* cited by examiner

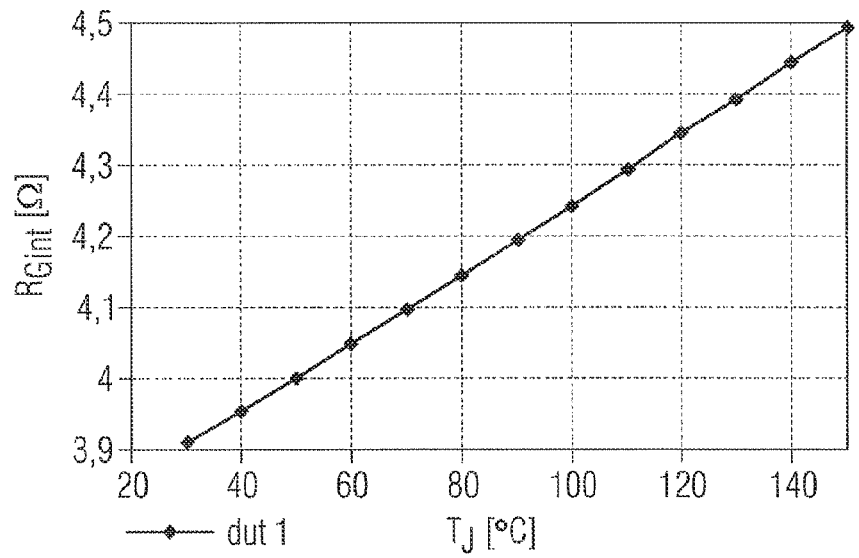
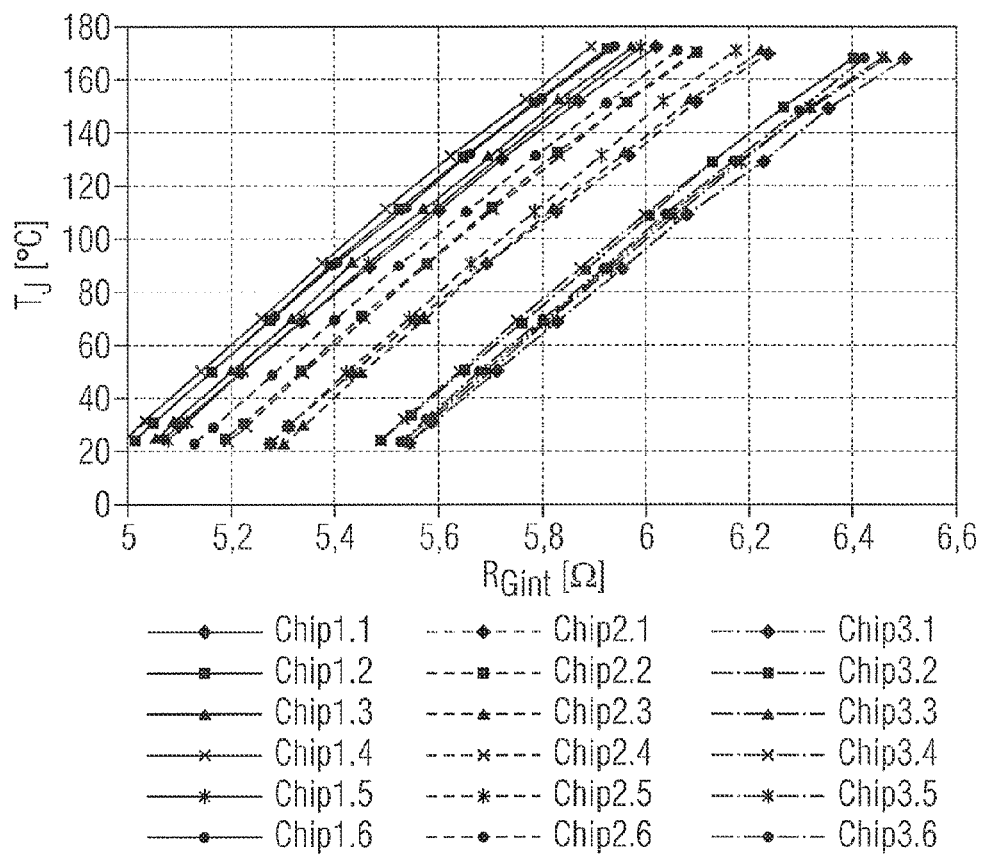

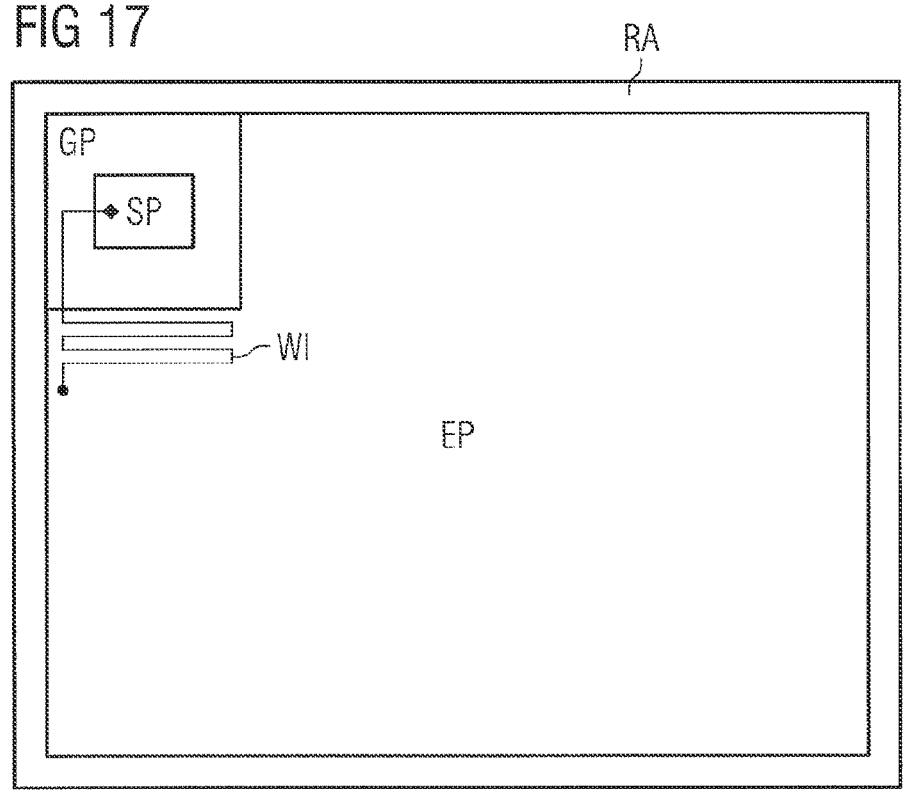
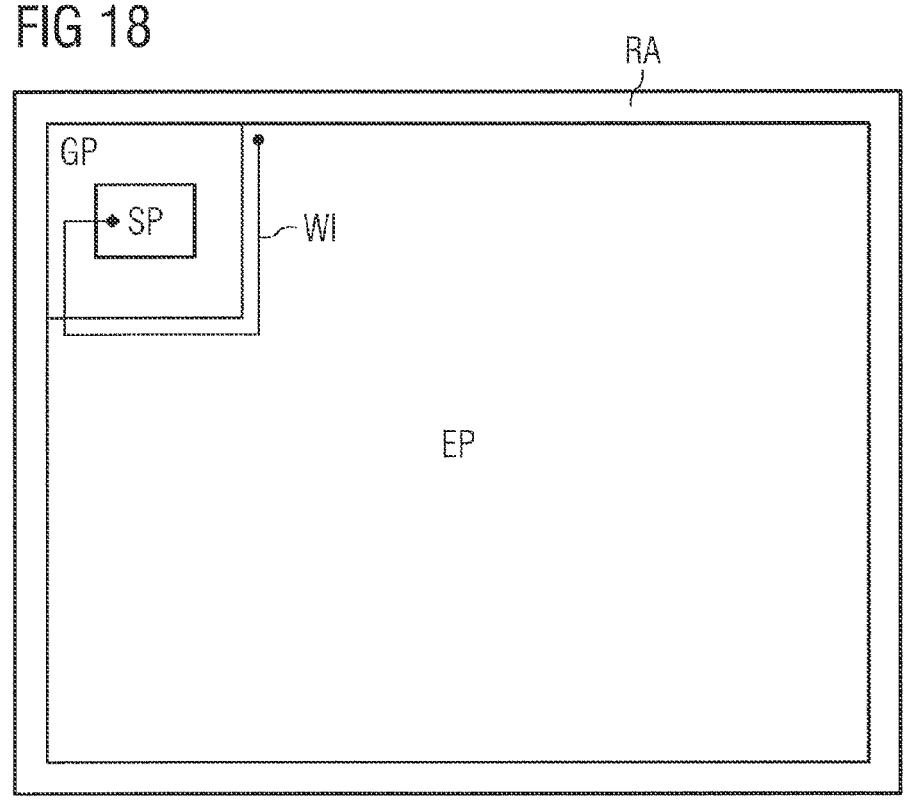

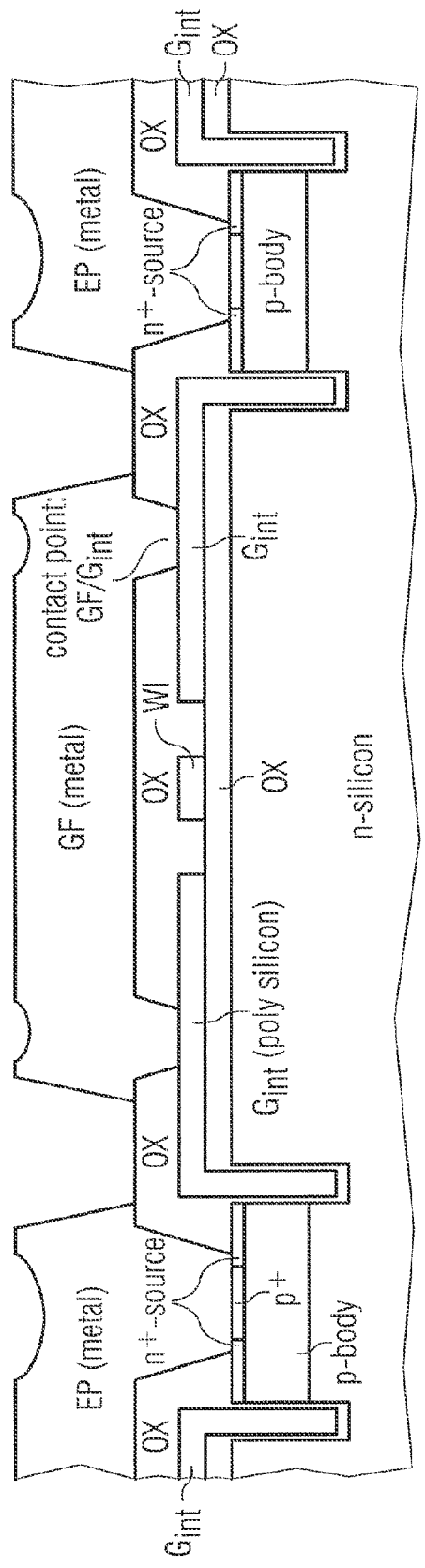

US 8,478,559 B2

SEMICONDUCTOR COMPONENT AND METHOD OF MAKING THE SAME

CROSS-REFERENCE TO RELATED APPLICATIONS

This application is a Divisional of U.S. patent application Ser. No. 12/168,369, now U.S. Pat. No. 8,155,916, entitled "SEMICONDUCTOR COMPONENT AND METHOD OF DETERMINING TEMPERATURE," having a filing date of Jul. 7, 2008, and is incorporated herein by reference.

BACKGROUND

The invention relates to a semiconductor component having a component which is concomitantly integrated into the semiconductor body of the semiconductor component and the temperature-dependent behavior of which is evaluated externally to the semiconductor component.

During the operation of semiconductor components, the power loss that always occurs leads to the heating of the semiconductor component. This heating is the greater, the more power is converted in the semiconductor component. Power transistors are one example of this. Power transistors are transistors which enable large current and voltage amplitudes and are therefore suitable for the direct operation of loads having a high power consumption. Power transistors are used, for example, in output stages and switching stages for industrial electronics and automotive engineering.

In this case the temperature of a semiconductor component represents an essential factor for the functionality of the component. An overtemperature of the semiconductor component produced, for example, as a result of a higher ambient temperature or as a result of malfunction, such as, for instance, short circuit of loads, can lead to damage or destruction of the semiconductor component and furthermore also to impairment or even destruction of the load. By way of example, the maximum permissible junction temperature is approximately 175 to 200 degrees Celsius in the case of silicon-based transistors or approximately 75 to 90 degrees Celsius in the case of germanium-based transistors. The respective semiconductor component is destroyed as a result of the temperature range being exceeded. It is essential, therefore, for a possible overtemperature of semiconductor components to be detected reliably and in timely fashion in order to be able to implement suitable measures such as, for example, turning off the semiconductor component or the load before critical temperature values are reached, and thus before the damage limit.

SUMMARY

One example of the invention relates to an arrangement for determining the temperature including at least one power semiconductor transistor and at least one component having two connecting lines, wherein the component is concomitantly integrated into a semiconductor body of an integrated semiconductor circuit having the power semiconductor transistor, and the component is thermally coupled to the power semiconductor transistor. Furthermore, the component is connected by one connecting line to a control electrode of the power semiconductor transistor and is connected by one connecting line to a load electrode of the power semiconductor transistor. The component has a temperature-dependent resistance and this resistance can be evaluated via the control electrode and the load electrode of the power semiconductor transistor. The temperature-dependent resistance of the component represents a measure of the internal temperature of the power semiconductor transistor.

A further example of the invention relates to a method for producing an integrated semiconductor circuit, wherein one connecting line of the component is connected to the control electrode of the power semiconductor transistor or one connecting line of the component is connected to the load electrode of the power semiconductor transistor only after carrying out a test of the blocking properties of the power semiconductor transistor between the control electrode and the load electrode of the power semiconductor transistor.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 is a diagram for illustrating the temperature dependence of the resistance value of an internal gate resistor of an integrated semiconductor transistor circuit.

FIG. 2 is a diagram for illustrating the batch dependence of the temperature characteristic curve of an internal gate resistor of an integrated semiconductor transistor circuit.

FIG. 17 illustrates in a diagram one embodiment of an arrangement of a load electrode zone, a control electrode zone, a component electrode zone, an edge termination region and an insulated resistance track of a component in an integrated semiconductor transistor circuit.

FIG. 18 illustrates in a diagram one embodiment of an arrangement of a load electrode zone, a control electrode zone, a component electrode zone, an edge termination region and an insulated resistance track of a component in an integrated semiconductor transistor circuit.

DETAILED DESCRIPTION

Figure 3:
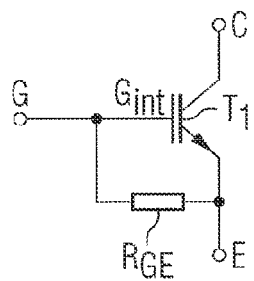
FIG. 3 illustrates a circuit diagram of one embodiment of an arrangement of an integrated IGBT semiconductor transistor circuit with an integrated component between gate and emitter.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In order to determine the temperature of a semiconductor component, such as a semiconductor transistor, for example, it is known to fit a temperature sensor on the housing of the semiconductor component or on the semiconductor body/ chip. What is disadvantageous in this case is that the sensor and the actual semiconductor component are two separate components, whereby only the temperature outside the semiconductor component is detected by the sensor, which temperature can deviate considerably from the temperature inside the semiconductor component and furthermore has an undesirable inertia in the case of rapid temperature changes inside the semiconductor component. However, precisely the temperature inside the semiconductor body is relevant for determining critical operating states.

In order to determine the internal temperature of a semiconductor component, it is known to provide a component in the same semiconductor body into which the semiconductor component is integrated. This exploits the fact that a variable of the component that can be detected by an evaluation unit is dependent on the temperature, such that the temperature in the semiconductor body can be deduced from the variable. Thus, power semiconductors are known, for example, in which the temperature of the depletion layer of the power semiconductor is detected by one or a plurality of additional diodes that are concomitantly integrated into the semiconductor body of the power semiconductor and are connected in series or in parallel.

In this case, the temperature-dependent forward voltage of the diode or diodes is available as a corresponding temperature signal. In this case, the forward voltage is generated by an impressed constant current in the diodes. The forward voltage represents a measure of the temperature of the power semiconductor. The impressed current and the evaluation of the forward voltage are typically provided by a driving and evaluation unit arranged externally to the integrated circuit of the power semiconductor.

The presence of one or a plurality of additional diode structures in the semiconductor body of the power component requires additional substrate area, however. Furthermore, such structures additionally integrated into the power semiconductor have to be provided with additional connecting lines which are led toward the outside and which likewise take up additional substrate area. The complexity of the entire integrated circuit is thereby increased and additional connecting lines have to be taken into account in the connection layout of the integrated circuit.

The embodiments described below are described predominantly on the basis of the example of an integrated semiconductor circuit which includes an IGBT power semiconductor transistor. Further embodiments of integrated power semiconductor circuits include e.g., MOSFET transistors, bipolar transistors and thyristors. In this case, the terms control electrode and load electrode are used for the general description of the invention. In the case of an IGBT power semiconductor transistor, the control electrode is a gate electrode and the load electrode is an emitter electrode; in the case of a MOSFET power semiconductor transistor, the control electrode is a gate electrode and the load electrode is a source electrode; in the case of a bipolar transistor, the control electrode is a base electrode and the load electrode is an emitter electrode; and in the case of a thyristor, the control electrode is a gate electrode and the load electrode is a cathode electrode.

Measurements on an internal gate resistor of an IGBT power transistor illustrate that the junction temperature of such a power transistor can be determined even without additionally integrated components on the surface of the power semiconductor. In this case, the temperature-dependent resistance values of the gate resistor between the gate electrode and an additional connection zone of the component are evaluated.

FIG. 1 illustrates in a diagram the dependence of the resistance value of an internal gate resistor $R_{Gint}$ (ordinate) of an integrated IGBT semiconductor transistor circuit as a function of the junction temperature $T_j$ (abscissa) in degrees Celsius. It can be seen in FIG. 1 that the measured resistance value of the internal gate resistor $R_{Gint}$ increases from 3.9 ohms at $T_j$=30° C. to 4.5 ohms at $T_j$=150° C. In general, in the case of resistors there is a linear relationship between the temperature and the resistance value. The relatively small resistance value of such an internal gate resistor $R_{Gint}$, which is in the region of a few ohms and is typically less than 10 ohms, can be problematic under certain circumstances. Owing to fluctuations in the production process, it is possible only with great complexity to fabricate internal gate resistors having identical values such as are necessary for a reliable temperature evaluation.

FIG. 2 illustrates in a diagram the resistance values (abscissa) of internal gate resistors of an integrated IGBT semiconductor transistor circuit as a function of the junction temperature (ordinate) of the integrated IGBT semiconductor transistor circuits from eighteen different production batches (chip 1.1 to chip 1.6, chip 2.1 to chip 2.6 and chip 3.1 to chip 3.6). In this case, the predetermined nominal resistance value of the internal gate resistor $R_{Gint}$ was 5 ohms at a temperature $T_j$=25° C. As can be seen in FIG. 2, at this temperature manufacturing-dictated fluctuations of the resistance values arise, however, which lie in a range of approximately 5 ohms to 5.6 ohms for the batches investigated. As in FIG. 1, FIG. 2 also in turn reveals well the linear dependence of the resistance value of the internal gate resistor $R_{Gint}$ on the temperature $T_j$.

The relatively small absolute resistance deviation of at most 0.6 ohm between the different production batches as determined leads, however, in conjunction with the small absolute resistance value of the internal gate resistor $R_{Gint}$, to an undesirable inaccuracy in the determination of the associated temperature. Furthermore, an adverse effect arises from the fact that the use of the gate resistor $R_{Gint}$ for determining the temperature presupposes an additional connection zone in the integrated semiconductor circuit and an additional connecting line led toward the outside in order to evaluate the temperature-dependent resistance of the gate resistor $R_{Gint}$, for example, using a corresponding evaluation unit, externally to the semiconductor component.

In accordance with one example of the invention, therefore, at least one additional component having a temperature-dependent resistance is concomitantly integrated into the integrated semiconductor circuit of a controllable power semiconductor component, such as e.g., an IGBT power semiconductor transistor. Such a component, e.g., a resistor having a temperature-dependent resistance value, has two connecting lines, wherein one connecting line is connected to the control electrode connection and one connecting line is connected to the load electrode connection of the power semiconductor component. The temperature-dependent component is embodied as a temperature-dependent resistor, for example, since the integration of a resistance track into the semiconductor body of an integrated semiconductor circuit requires significantly less area in the integrated semiconductor circuit by comparison with, for example, the integration of a diode structure, and the production process is also significantly simplified.

Furthermore, such a resistor is embodied with high resistance and, for example, using the same production method as for the resistor (see $R_{Gint}$) in the lead between control electrode and control electrode connection of the power semiconductor, such that the integration of the component does not necessitate an additional method process in the production of the semiconductor component. The high-resistance embodiment—by comparison with the internal gate resistor $R_{Gint}$—of the resistor for the evaluation of the junction temperature of the semiconductor component is achieved by corresponding configuration of the resistance track in the semiconductor component (see FIG. 15 to FIG. 27).

FIG. 3 illustrates in a circuit diagram an exemplary embodiment of the integration of a resistance component having a temperature-dependent resistance into the integrated semiconductor circuit of a controllable power semiconductor. FIG. 3 illustrates in a circuit diagram an IGBT as power semiconductor transistor $T_1$ and the resistance component $R_{GE}$. The resistance component $R_{GE}$ is connected by a first connection to the gate connection G (gate pad) and the internal gate electrode $G_{int}$ (control electrode) of the IGBT $T_1$ and is connected by a second connection to the emitter electrode E (load electrode) and the emitter connection (emitter pad) of the power semiconductor. Since the resistor $R_{GE}$ is embodied with high resistance, in the steady state (that is to say in the ON state and in the OFF state of the IGBT) of a gate control voltage applied to the gate connection G—that is to say before and after corresponding switching operations—exclusively a correspondingly small current flows through the resistor $R_{GE}$ such that an evaluation unit does not have to provide an undesirably high power for evaluating the temperature-dependent variable of the resistor $R_{GE}$.

In this way, given a constant gate voltage (e.g., +15V in the ON state and −15V in the OFF state of the IGBT), the current flowing solely through the resistor $R_{GE}$ can be measured. Given a constant very small current, as an alternative to this it is also possible to evaluate the voltage across the resistor $R_{GE}$. In this case, the voltage across or the current through the resistor $R_{GE}$ is typically evaluated by a driving and evaluation unit that can be arranged e.g., externally to the power component. In this case, the current and the voltage, respectively, represent a measure of the temperature-dependent resistance value of the resistor $R_{GE}$ and are used for determining the internal junction temperature of the power component.

No additional leads to the resistor $R_{GE}$ have to be realized in the integrated semiconductor circuit of the IGBT since the gate connection G (that is to say the gate pad) and the emitter connection E (that is to say the emitter pad) of the IGBT can also be used for measuring the current or voltage values through or across the resistor $R_{GE}$. The additional outlay for a connection of further leads (bonding) and the routing of lines out of the semiconductor circuit is thereby avoided.

Furthermore, by using a suitable configuration of the resistor $R_{GE}$ between control electrode and load electrode in the integrated semiconductor circuit of the power transistor, it is possible to achieve a significantly reduced area requirement for the semiconductor structure of the resistor $R_{GE}$ by comparison with existing solutions, as is explained in detail further below and can be seen, for example, in FIG. 15 to FIG. 27.

A further advantage of a resistor $R_{GE}$ integrated in this way is that protection against electrostatic discharge is thereby obtained, as a result of which external measures for protection against electrostatic discharges are not required in integrated semiconductor circuits formed in this way.

Yet another advantage also arises from the fact that controllable power semiconductors formed in this way are held in the switched-off state during switch-on operations when the maximum switching voltage is not yet fully present. In this case, such a resistor $R_{GE}$ connected between gate electrode and emitter electrode of an IGBT has in a suitable manner resistance values in the range of 1000 ohms and 20 megohms, for example, resistance values in the range of 2 kilohms and 15 kilohms.

Figure 4:
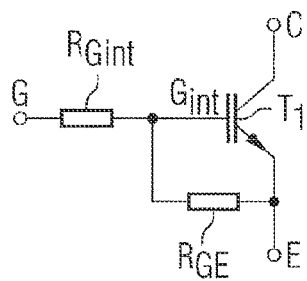
FIG. 4 illustrates a circuit diagram of one embodiment of an arrangement of an integrated IGBT semiconductor transistor circuit with an integrated gate resistor and integrated component connected to the gate electrode downstream of the gate resistor.

FIG. 4 illustrates in a circuit diagram an exemplary embodiment of an arrangement of an integrated IGBT semiconductor transistor circuit with an integrated internal gate resistor $R_{Gint}$ and an integrated resistance component $R_{GE}$. In this case, the resistance component $R_{GE}$ is connected to the emitter connection E and the internal gate electrode $G_{int}$ of the IGBT $T_1$. The difference with respect to the example from FIG. 3 is that a (transistor-internal) gate resistor $R_{Gint}$ is additionally arranged between the gate connection G, that is to say the gate pad, and the internal gate electrode $G_{int}$. Such a gate resistor $R_{Gint}$ is often necessary in power transistors.

Figure 5:
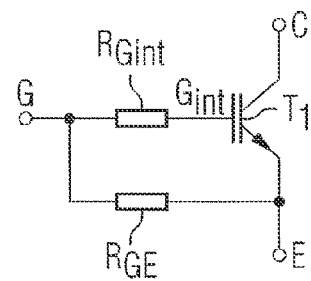
FIG. 5 illustrates a circuit diagram of an arrangement of an integrated IGBT semiconductor transistor circuit with an integrated gate resistor and an integrated component connected to the gate electrode upstream of the gate resistor.

FIG. 5 illustrates in a circuit diagram a further exemplary embodiment of an arrangement of an integrated IGBT semiconductor transistor circuit with an integrated internal gate resistor $R_{Gint}$ and an integrated resistance component $R_{GE}$. In this case, the resistor $R_{GE}$ is once again connected to the emitter connection E of the IGBT $T_1$. Furthermore, the resistor $R_{GE}$ is directly connected to the gate connection G (that is to say the gate pad) of the IGBT. The gate connection G is once again connected to the internal gate electrode $G_{int}$ via the gate resistor $R_{Gint}$.

Figure 6:
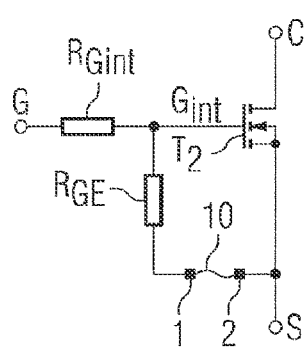
FIG. 6 illustrates a circuit diagram of an arrangement of an integrated MOSFET semiconductor transistor circuit with an integrated gate resistor and an integrated component connected to the gate electrode downstream of the gate resistor, wherein the connection between a connecting line of the component and the source electrode of the MOSFET is implemented in a separate step.

FIG. 6 illustrates in a circuit diagram an exemplary embodiment of an arrangement of an integrated MOSFET semiconductor transistor circuit with an integrated gate resistor $R_{Gint}$ and an integrated resistor $R_{GE}$ for temperature determination, which, as in the example from FIG. 3, is connected to the gate electrode, wherein the connection between a connecting line of the resistor $R_{GE}$ and the source connection S of the MOSFET is implemented in a separate step, for example, by using a wire connection 10 (bond), which can be implemented at a later point in time in the production process and which bridges the connection to the source connection S of the MOSFET between the points 1 and 2.

This makes it possible, in the course of the production process of the integrated semiconductor circuit, with an open connection between the points 1 and 2, to test the blocking properties of the power semiconductor without the blocking properties being corrupted by the resistor $R_{GE}$. After successful testing of the power semiconductor, the connection between the points 1 and 2 of the connecting line of the resistor $R_{GE}$ is implemented in a subsequent production step.

In this case, the bonding connection 10 between the points 1 and 2 can be implemented, for example, by an overbonding of two connection areas arranged at the points 1 and 2 of the semiconductor circuit. In a further example, the connection between the resistor $R_{GE}$ and the source connection S of the MOSFET can also be implemented by a connecting line of the resistor $R_{GE}$, which connecting line is to be fitted to the resistor $R_{GE}$ anyway and is to be connected to the source electrode, first being produced in a separate processing step.

Figure 7:
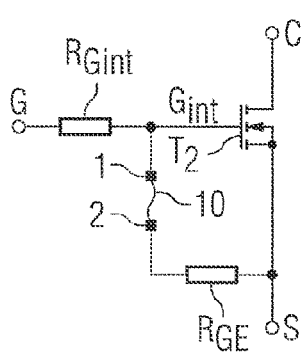
FIG. 7 illustrates a circuit diagram of an arrangement of an integrated MOSFET semiconductor transistor circuit with an integrated gate resistor and an integrated component connected to the gate electrode downstream of the gate resistor, wherein the connection between a connecting line of the component and the gate electrode of the MOSFET is implemented in a separate step.

FIG. 7 illustrates in a circuit diagram an exemplary embodiment of an arrangement of an integrated MOSFET semiconductor transistor circuit with an integrated gate resistor $R_{Gint}$ and an integrated resistance component $R_{GE}$ for temperature determination. The resistance component $R_{GE}$ is connected by one connecting line to the source connection S, wherein here the bonding connection 10 between a further connecting line of the resistor $R_{GE}$ and the internal gate electrode $G_{int}$ of the MOSFET $T_2$ is implemented in a separate step. This is done analogously to the example illustrated in FIG. 6 by using a wire connection (bond) which can be implemented at a later point in time in the production process and which electrically connects the resistor $R_{GE}$ to the gate electrode $G_{int}$ of the MOSFET $T_2$. As in accordance with FIG.

6, here as well a test of the blocking properties of the power semiconductor embodied here as a MOSFET, which test is uninfluenced by the resistor $R_{GE}$, is made possible in the context of the production process.

Figure 8:
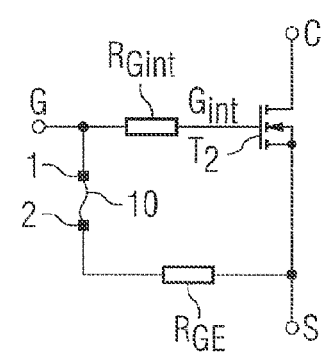
FIG. 8 illustrates a circuit diagram of an arrangement of an integrated MOSFET semiconductor transistor circuit with an integrated gate resistor and an integrated component connected to the gate electrode upstream of the gate resistor, wherein the connection between a connecting line of the component and the gate electrode of the MOSFET is implemented in a separate step.

FIG. 8 illustrates in a circuit diagram an exemplary embodiment of an arrangement of an integrated MOSFET semiconductor transistor circuit with an integrated gate resistor $R_{Gint}$ and an integrated resistor $R_{GE}$ for temperature measurement, which is connected to the gate connection G (the gate pad) upstream of the gate resistor $R_{Gint}$, wherein the bonding connection 10 between the resistor $R_{GE}$ and the gate connection G of the MOSFET $T_2$ is embodied in a separate process as also in the examples illustrated in FIG. 6 or FIG. 7.

The connection of a connecting line of the temperature-dependent resistor $R_{GE}$ for temperature measurement to the control electrode connection of a power semiconductor upstream of the internal gate resistor $R_{Gint}$, as is also illustrated in FIG. 5 and FIG. 7, has the effect that the influence—which although small on account of the resistor is nevertheless present—of the temperature dependence of the internal gate resistor RG is completely eliminated. On account of a bipolar gate control voltage present during the quiescent phases (constant positive or negative gate voltage) at the gate connection G (that is to say before and after corresponding switching operations) a current exclusively flows through the resistor $R_{GE}$.

Figure 9:
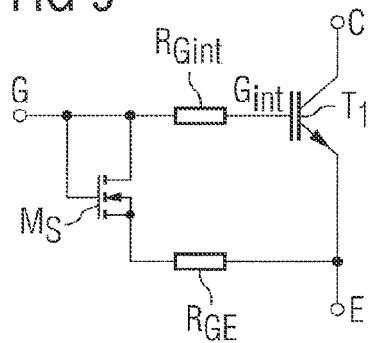
FIG. 9 illustrates a circuit diagram of an arrangement of an integrated IGBT semiconductor transistor circuit with an integrated gate resistor and an integrated component connected to the gate electrode upstream of the gate resistor, wherein the connection between a connecting line of the component and the gate electrode of the IGBT is implemented by a switching element concomitantly integrated into the semiconductor circuit.

FIG. 9 illustrates in a circuit diagram an arrangement of an integrated IGBT semiconductor transistor circuit in according with FIG. 8, wherein the connection between a connecting line of the component $R_{GE}$ and the gate connection G of the IGBT, in contrast to the example from FIG. 8, is implemented by a switching element $M_s$ concomitantly integrated into the semiconductor circuit. In the exemplary embodiment in accordance with FIG. 8, the switching element is embodied as a MOSFET which is connected by its drain electrode to the gate connection G of the IGBT upstream of the internal gate resistor and is connected by its source electrode to the resistor $R_{GE}$. In one embodiment, instead of being connected to the gate connection G, the MOSFET $M_s$ could also be directly connected to the internal gate electrode $G_{int}$.

Furthermore, the gate electrode of the MOSFET transistor is connected to the gate electrode connection of the IGBT power semiconductor transistor. In this way, the MOSFET transistor is driven by the gate voltage of the power semiconductor and a connection between the gate line and the resistor $R_{GE}$ is produced when a corresponding gate voltage is present at the gate electrode of the IGBT, such that the latter is in a switched-on state. This ensures that the junction temperature of the IGBT can be evaluated via the resistor $R_{GE}$ if a current that leads to a heating to be monitored of the integrated semiconductor circuit flows through the IGBT. As an alternative to the exemplary embodiment in accordance with FIG. 9, instead of a MOSFET transistor it is also possible to use a non-controllable switching element which becomes conductive automatically at a specific temperature.

Such a switching element can be embodied as a thyristor, for example, which, at a specific temperature, such as 50° C., 70° C. or 100° C., for example, changes to the conductive state without an additional control signal and thus brings about the connection of the temperature-dependent component to the control and/or load electrode of the power semiconductor.

Figure 10A:
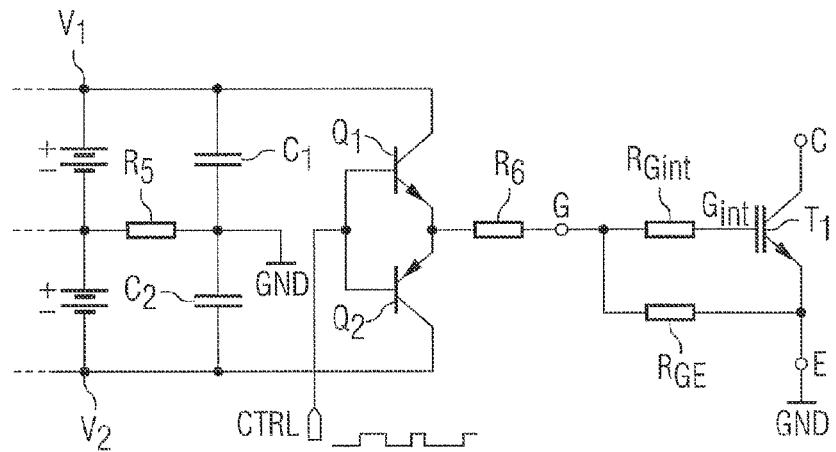
FIGS. 10a-b illustrate circuit diagrams of an arrangement of an integrated IGBT semiconductor transistor circuit with an integrated gate resistor and an integrated component connected to the gate electrode upstream of the gate resistor, and an exemplary embodiment of a driving and evaluation unit for driving the semiconductor transistor and for evaluating the temperature-dependent resistance of the component.

FIG. 10a is a circuit diagram of an exemplary embodiment of a circuit arrangement in accordance with the example from FIG. 5 with an exemplary driving and evaluation unit for driving the semiconductor transistor and for evaluating the temperature-dependent resistance of the component $R_{GE}$. In accordance with FIG. 10, the driving and evaluation unit includes a first DC voltage source $V_1$, a second DC voltage source $V_2$, a resistor $R_5$ and two capacitors $C_1$ and $C_2$. Furthermore, the driving and evaluation unit includes a resistor R6 and also two bipolar transistors $Q_1$ and $Q_2$. In this case, transistor $Q_1$ is embodied as an npn transistor and transistor $Q_2$ is embodied as a pnp transistor.

In accordance with FIG. 10a, the positive output of the DC voltage source $V_1$ is connected to a first connecting line of the capacitor $C_1$ and a collector electrode of the transistor $Q_1$. The negative output of the DC voltage source $V_2$ is connected to a first connecting line of the capacitor $C_2$ and a collector electrode of the transistor $Q_2$. The negative output of the DC voltage source $V_1$ and the positive output of the DC voltage source $V_2$ are connected to a first connecting line of the resistor $R_5$ and a second connecting line of the capacitor $C_1$ and a second connecting line of the capacitor $C_2$ are connected both to one another and to a second connecting line of the resistor $R_5$. Furthermore, in accordance with FIG. 10a, the two base electrodes of the transistors $Q_1$ and $Q_2$ are connected to one another and also to an input line for a drive signal. The two emitter electrodes of the transistors $Q_1$ and $Q_2$ are connected to one another and to a first connecting line of the resistor $R_6$, the second connecting line of which is connected via the gate resistor RG to the gate electrode of the IGBT and a connecting line of the resistor $R_{GE}$.

If one of the two transistors $Q_1$ or $Q_2$ is put into a conductive state by using a drive signal formed with a rectangular waveform, for example, the current peaks for switching the power semiconductor component (here IGBT) on and off are provided by the capacitors $C_1$ and $C_2$, respectively. In the time phases in which a constant voltage is present at the control electrode of the semiconductor power component, that is to say in the time ranges in which the power semiconductor is fully switched on or off, the capacitors $C_1$ and $C_2$ are charged again by the DC voltage sources $V_1$ and $V_2$, respectively, via the resistor $R_5$. As soon as the capacitors $C_1$ and $C_2$ are fully charged, only that current which flows through the resistor $R_{GE}$ (either the base-emitter diode of $Q_1$ or of $Q_2$ is conducting) flows through the resistor $R_5$ of the driving and evaluation unit.

This causes across the resistor $R_5$ a voltage drop that represents a measure of the current flowing through the resistor $R_{GE}$ integrated in the integrated semiconductor circuit and thus a measure of the internal temperature of the power semiconductor component. The voltage present across the resistor $R_5$ can therefore be used, for example, to bring about a protective shutdown of the power semiconductor component in the event of a predetermined junction temperature of the power semiconductor component being exceeded which results in a corresponding voltage drop across the resistor $R_5$.

The voltage present across the resistor $R_5$ can also be forwarded to an electronic evaluation and control unit (not illustrated explicitly) connected downstream, in which an evaluation of the junction temperature and a corresponding reaction to the temperature of the power semiconductor component take place. In this case, the resistor $R_5$ is dimensioned in a suitable manner such that only a small portion of the voltage required from the voltage sources $V_1$ and $V_2$ for operating the driving of the power semiconductor component, for example, one volt, is present across the resistor $R_5$.

Figure 10B:
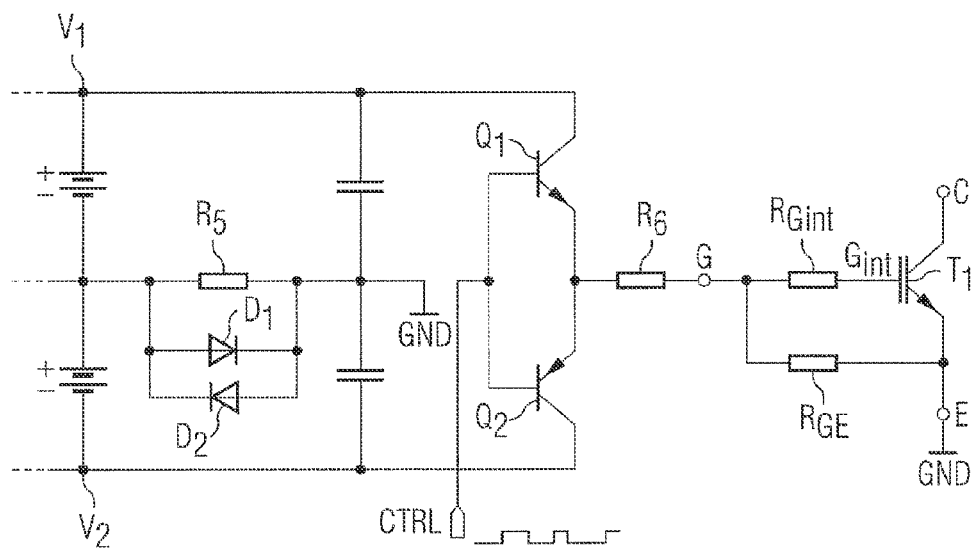

The circuit diagram from FIG. 10b differs from the circuit diagram in FIG. 10a only by virtue of the fact that two diodes $D_1$ and $D_2$ are also connected in parallel with the resistor $R_5$. In this case, the diodes $D_1$ and $D_2$ are connected back-to-back with respect to one another and serve for limiting the voltage across the resistor $R_5$ while the internal gate electrode $G_{int}$ of the IGBT $T_1$ is charged or discharged. The diodes can also be replaced by controlled switches, e.g., MOS or bipolar transistors, in order to be able to reduce even further the voltage drop across the resistor $R_5$ during the charging and discharging of the gate electrode $G_{int}$.

Figure 11:
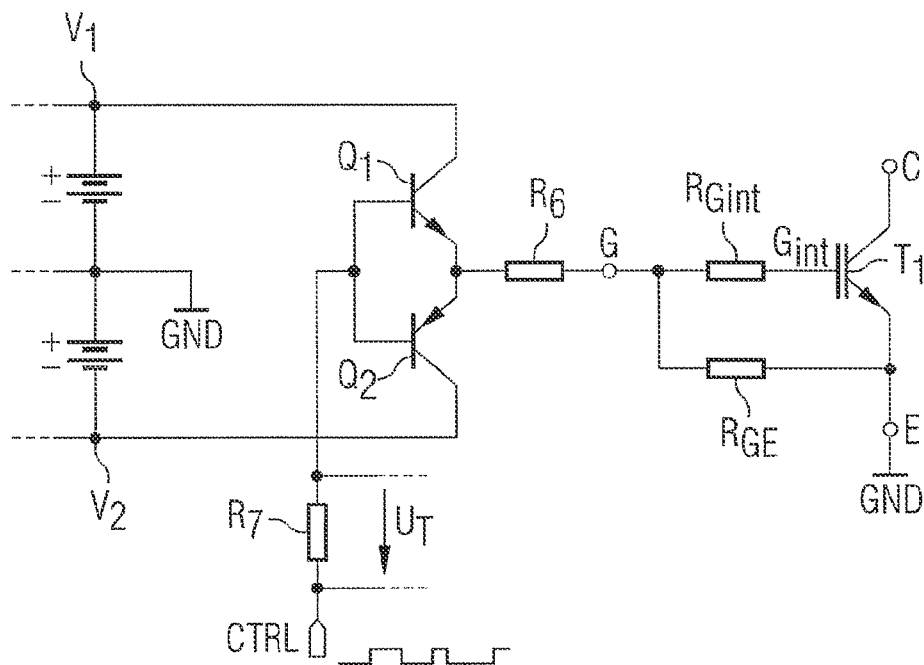
FIG. 11 illustrates a circuit diagram of an arrangement of an integrated IGBT semiconductor transistor circuit with an integrated gate resistor and an integrated component connected to the gate electrode upstream of the gate resistor, and a further exemplary embodiment of a driving and evaluation unit for driving the semiconductor transistor and for evaluating the temperature-dependent resistance of the component.

FIG. 11 illustrates in a circuit diagram an arrangement of an integrated IGBT semiconductor transistor circuit in accordance with FIG. 10a or 10b with a further exemplary embodiment of a driving and evaluation unit for driving the semiconductor transistor and for evaluating the temperature-dependent resistance of the component $R_{GE}$. In this case, the driving and evaluation unit in accordance with FIG. 11 includes a DC voltage source $V_1$, a DC voltage source $V_2$, a resistor R6 and a resistor R7. Furthermore, the driving and evaluation unit once again includes two bipolar transistors $Q_1$ and $Q_2$. In this case, transistor $Q_1$ is embodied as an npn transistor and transistor $Q_2$ is embodied as a pnp transistor.

In accordance with FIG. 11, the positive output of the DC voltage source $V_1$ is connected to a collector electrode of the transistor $Q_1$. The negative output of the DC voltage source $V_2$ is connected to a collector electrode of the transistor $Q_2$. Furthermore, in accordance with FIG. 11, the two base electrodes of the transistors $Q_1$ and $Q_2$ are connected to one another and to a first connecting line of the resistor $R_7$, wherein the second connecting line of the resistor $R_7$ represents the input connection for a drive signal. The two emitter electrodes of the transistors $Q_1$ and $Q_2$ are connected to one another and to a first connecting line of the resistor R6, the second connecting line of which is connected via the gate resistor RG to the gate electrode of the IGBT and a connecting line of the resistor $R_{GE}$.

If one of the two transistors $Q_1$ or $Q_2$ is put into the conductive state by a drive signal formed with a rectangular waveform, for example, the current peaks for switching the controllable semiconductor power component (here IGBT) on and off are provided via the transistors by the voltage sources $V_1$ and $V_2$, respectively, via the transistors $Q_1$ and $Q_2$, respectively, and the resistor $R_6$ at the control electrode of the IGBT. In the time phases in which a constant voltage is present at the control electrode of the semiconductor power component, that is to say in the time ranges in which the power semiconductor is fully switched on and off, a current representing a measure of the current flowing through the resistor $R_{GE}$ (the base-emitter diode of $Q_1$ or of $Q_2$ is conducting) flows through the resistor $R_7$ of the driving and evaluation unit. The current gain factor of the respective transistors $Q_1$ and $Q_2$ should be taken into account in this case. The current flowing through the resistor $R_7$ causes a voltage $U_T$ across the resistor $R_7$ that represents a measure of the internal temperature of the power semiconductor component.

Figure 12:
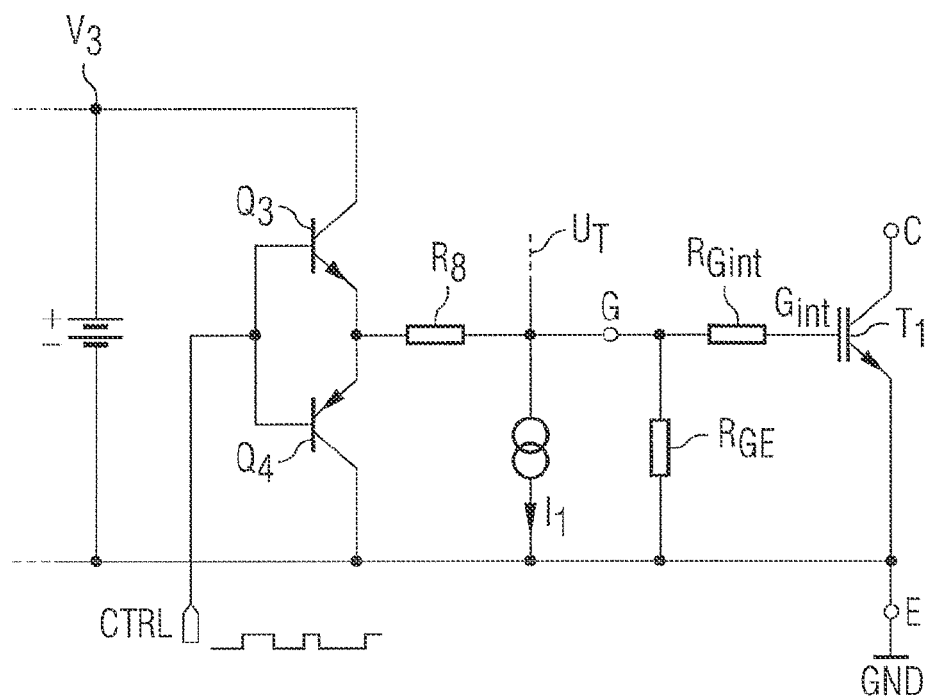
FIG. 12 illustrates a circuit diagram of an arrangement of an integrated IGBT semiconductor transistor circuit with an integrated gate resistor and an integrated component connected to the gate electrode upstream of the gate resistor, and a further exemplary embodiment of a driving and evaluation unit for driving the semiconductor transistor and for evaluating the temperature-dependent resistance of the component.

FIG. 12 is a circuit diagram of a circuit arrangement with an integrated IGBT semiconductor transistor circuit (cf. e.g., FIG. 10 or FIG. 11) with a further exemplary embodiment of the driving and evaluation unit for driving the semiconductor transistor and for evaluating the temperature-dependent resistance of the component $R_{GE}$. In this case, the driving and evaluation unit in accordance with FIG. 12 includes a DC voltage source $V_3$, a current source $I_1$, a resistor $R_8$ and also a driver stage including the two bipolar transistors $Q_3$ and $Q_4$.

In accordance with FIG. 12, the positive output of the voltage source $V_3$ is connected to a collector electrode of the transistor $Q_3$. The negative output of the DC voltage source $V_3$ is connected to a collector electrode of the transistor $Q_4$. Furthermore, in accordance with FIG. 12, the two base electrodes of the transistors $Q_3$ and $Q_4$ are connected to one another and to an input connection for a drive signal. The two emitter electrodes of the transistors $Q_1$ and $Q_2$ are connected to one another and to a first connecting line of the resistor $R_8$, the second connecting line of which is connected to the gate connection (gate pad) G of the IGBT $T_1$. The gate connection G is connected via the transistor-internal gate resistor $R_{Gint}$ to the gate electrode of the IGBT, a first connecting line of the resistor $R_{GE}$ and a first connecting line of the current source $I_1$. A second connecting line of the current source $I_1$ is connected to a second connecting line of the resistor $R_{GE}$, to the collector electrode of the transistor $Q_4$ and the negative output of the DC voltage source $V_3$.

If a drive signal formed with a rectangular waveform, for example, is applied to the control input connection of the driving and evaluation circuit in accordance with FIG. 12, one of the two transistors $Q_3$ or $Q_4$ is put into the conductive state, whereby via the resistor $R_8$, either the positive or the negative potential of the voltage source is provided as switch-on or -off signal of the IGBT at the control electrode thereof.

In the switched-off state of the IGBT, in this case a gate voltage of 0 volts is provided by the driving and evaluation circuit in accordance with FIG. 12 since the circuit has only one voltage source $V_3$ in contrast to the exemplary embodiments in accordance with FIG. 10 and FIG. 11. In this switched-off state of the IGBT, however, the current source $I_1$ brings about a voltage $U_T$ across the temperature-dependent resistor $R_{GE}$ of the integrated power semiconductor. The voltage $U_T$ can be used as a measure of the internal temperature of the power semiconductor in this switching state. The voltage $U_T$ can be tapped off at the gate connection between the driving and evaluation circuit and the power semiconductor and subsequently be evaluated (see also the description regarding FIG. 10a).

Figure 13A:
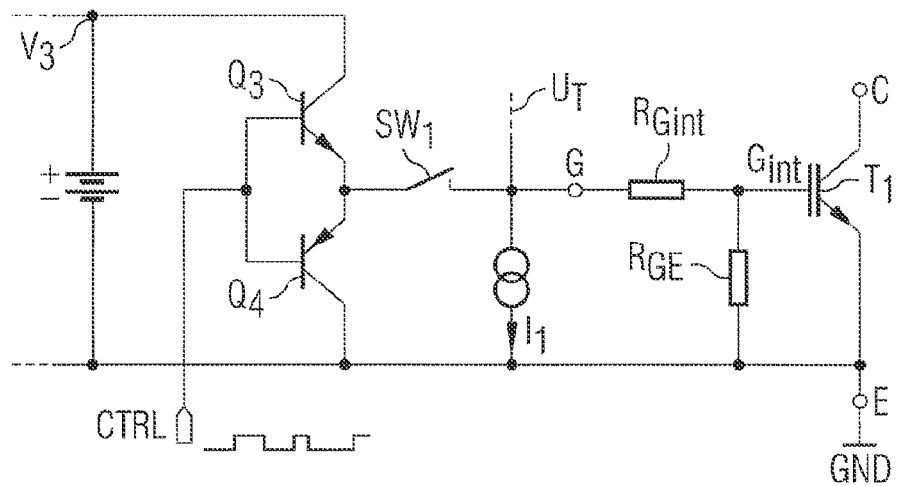
FIGS. 13a-c illustrate circuit diagrams of embodiments similar to that from FIG. 12.
Figure 13B:
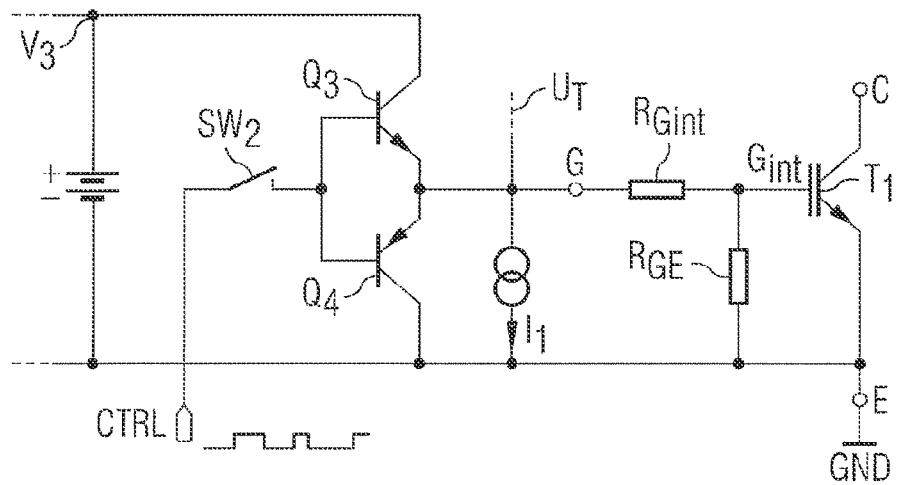
Figure 13C:
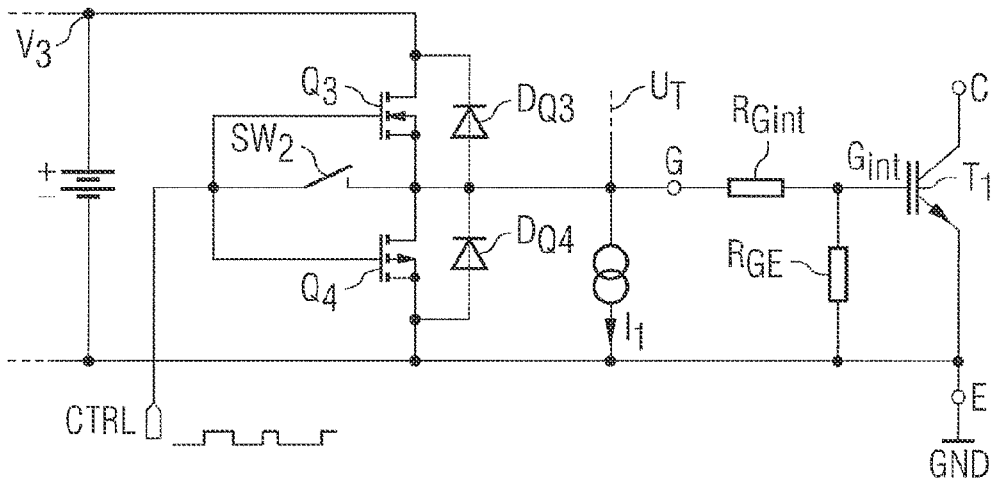

The exemplary embodiments from FIGS. 13a, 13b and 13c operate in a manner similar to the example from FIG. 12. The circuit arrangement from FIG. 13a differs from the example from FIG. 12 essentially by virtue of the fact that instead of the resistor $R_8$, a switch $SW_1$ is connected between the output of the driver stage ($Q_3$, $Q_4$) and the gate connection G (gate pad). A further difference, which is insignificant for the functioning of the circuit, is that in this example the resistor $R_{GE}$ is not connected between emitter connection E and gate connection G of the power transistor $T_1$ but rather directly between emitter connection E and internal gate electrode $G_{int}$.

The power transistor circuit ($T_1$, $R_{Gint}$, $R_{GE}$) can be disconnected from the driver stage via the switch $SW_1$. The temperature measurement is effected in the OFF state of the IGBT $T_1$. At the beginning of a measuring operation, the switch $S_1$ is opened, and the driver circuit is then decoupled from the measuring circuit ($R_{Gint}$, $R_{GE}$). The current $I_1$ flowing through the current source can now only flow through the resistors $R_{Gint}$ and $R_{GE}$ (in a quasi-static mode of consideration). The current $I_1$ of the current source brings about a voltage drop $U_T$ across the series circuit formed by the internal gate resistor $R_{Gint}$ and the resistor $R_{GE}$. The voltage drop $U_T$, on account of the temperature dependence of the resistor $R_{GE}$ and of the gate resistor $R_{Gint}$, is of course also temperature-dependent and can be tapped off between gate connection G (gate pad) and emitter connection E (emitter pad) for temperature measurement. There are no restrictions with regard to the direction of the measurement current $I_1$. However, the current $I_1$ is permitted to be chosen at most with the magnitude such that the voltage $U_T$, even at the maximum temperature, does not exceed the threshold voltage of the power transistor $T_1$ in order to avoid an undesirable switch-on of the transistor $T_1$.

The example from FIG. 13b is very similar to the example from FIG. 13a. The only difference is that the switch is not connected downstream of the driver output of the driver stage ($Q_3$, $Q_4$), but rather is connected upstream of the input of the driver stage. In this example, the switch is designated by $SW_2$. The functioning of the circuit from FIG. 13b is essentially identical to the circuit from FIG. 13a. At the beginning of a measuring operation, the switch $SW_2$ is opened and the driver stage is thus isolated from the signal source providing the drive signal CTRL. The driver stage is consequently at high resistance (that is to say its output resistance is high) and the entire driver stage ($Q_3$, $Q_4$) is practically decoupled from the measuring circuit ($R_{Gint}$, $R_{GE}$). The temperature measurement functions in the same way as in the example in accordance with FIG. 13a.

The example from FIG. 13c is very similar to the example from FIG. 13b with the difference that MOSFETs are used instead of bipolar transistors in the driver stage ($Q_3$, $Q_4$). The switch $SW_2$ connects the gate and source connections of the driver transistors. At the beginning of a measuring operation the switch $SW_2$ is closed and the driver transistors $Q_3$ and $Q_4$ are therefore turned off. The driver stage is at high resistance for the temperature measurement—as in the previous example—and therefore practically decoupled from the measuring circuit. The temperature measurement functions in the same way as in the examples in accordance with FIG. 13a or FIG. 13b. On account of the unavoidable body diodes $DQ_3$ and $DQ_4$ in the case of a MOSFET driver stage, the current $I_1$ is permitted to be chosen at most where the magnitude is such that the voltage drop $U_T$ across the resistors $R_{Gint}$ and $R_{GE}$ does not exceed the forward voltage of the diode $DQ_2$, since the measurement result can otherwise be corrupted.

Figure 14:
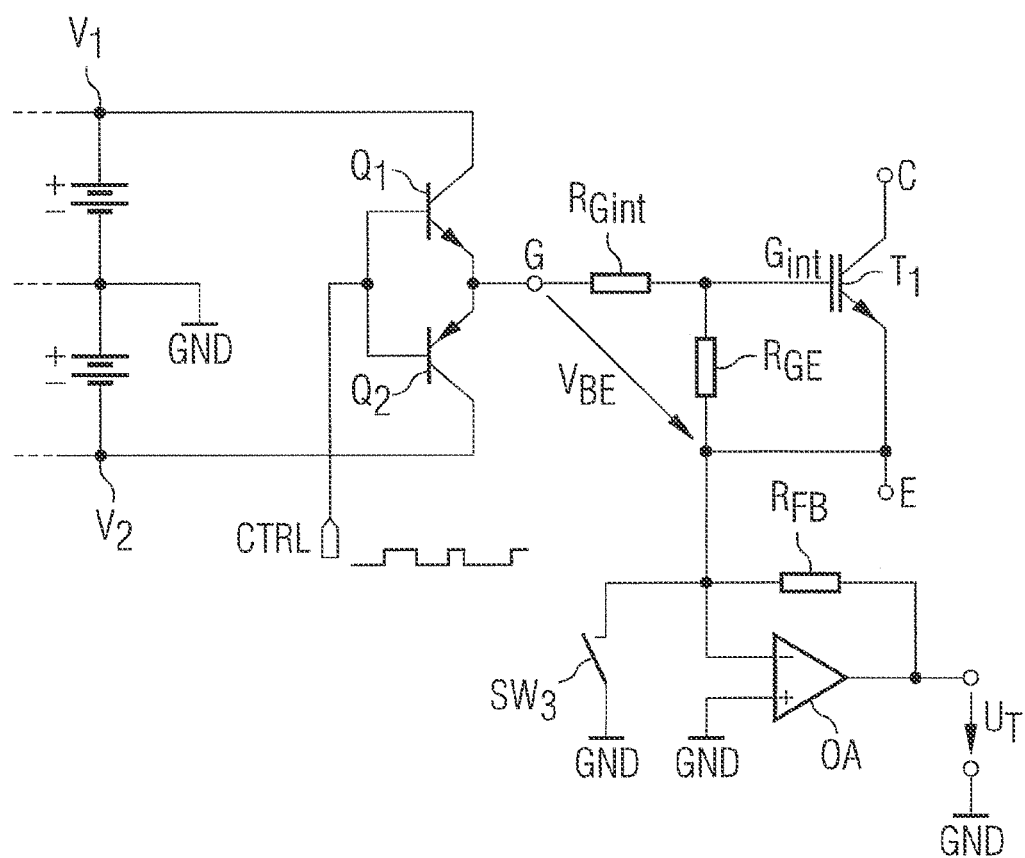
FIG. 14 is illustrates circuit diagram of an arrangement of an integrated IGBT semiconductor transistor circuit with an integrated gate resistor and an integrated component connected to the gate electrode downstream of the gate resistor, and a further exemplary embodiment of a driving and evaluation unit with an operational amplifier.

The exemplary embodiment from FIG. 14 permits, in contrast to the examples from FIGS. 13a-c, a temperature measurement in the ON and in the OFF state of the power transistor $T_1$. In a manner similar to the exemplary embodiments from FIG. 10, the gate connection G of the power transistor arrangement ($T_1$, $R_{Gint}$, $R_{GE}$) is driven in bipolar fashion by using a driver stage including the transistors $Q_1$ and $Q_2$. In a steady state, the internal gate electrode $G_{int}$ is charged either positively or negatively with respect to the potential of the emitter electrode E and a gate current flows as measurement current only via the resistors $R_{Gint}$ and $R_{GE}$. The magnitude of the current depends on the voltage $V_{BE}$—predetermined by the driver stage ($Q_1$, $Q_2$)—between gate connection G and emitter connection E and the junction temperature $T_j$ of the power transistor $T_1$.

Apart from during a measuring operation, the emitter connection E is connected to a constant potential, e.g., ground GND, via a closed switch $SW_3$. At the beginning of a measuring operation, the switch $SW_3$ is opened and the measurement current instead flows via a current-voltage converter, which can include, for example, an operational amplifier OA with a feedback resistor $R_{FB}$. In this example, the operational amplifier provides an output voltage $U_T$ that can be calculated as follows:

$$U_T = R_{FB} \cdot V_{BE} / (R_{Gint} + R_{GE})$$

As the temperature increases, the resistance value of the resistor $R_{GE}$ increases, and the output voltage correspondingly decreases depending on the junction temperature $T_j$.

The exemplary embodiments illustrated in FIG. 3 to FIG. 14 illustrate how an additional component having a temperature-dependent resistance characteristic curve is integrated into the integrated semiconductor circuit of a controllable power semiconductor in such a way that the resistance of the component can be evaluated via the control electrode and the load electrode of the power semiconductor without additional connecting lines having to be realized and led out from the integrated semiconductor circuit for this purpose.

The subsequent figures illustrate exemplary embodiments in which, as a further essential advantage of the invention, exemplary embodiments for the integrated semiconductor circuit are illustrated in which, as a further essential advantage of the invention, the additionally required area portion taken up by the additional temperature-dependent component in the integrated semiconductor circuit is greatly reduced or even avoided. For this purpose, the temperature-dependent component connected between the control electrode and the load electrode of a controllable power semiconductor is embodied in the form of an electrically insulated resistance track as temperature-dependent resistor.

All of the subsequent exemplary embodiments in accordance with FIG. 15 to FIG. 27 are in this case illustrated on the basis of the example of an IGBT power semiconductor. In this case, in all the exemplary embodiments, the insulated resistance track WI is embodied, for example, from polycrystalline silicon which is embodied with an increased resistivity in comparison with the polycrystalline silicon of an internal gate resistor $R_{Gint}$.

Figure 15:
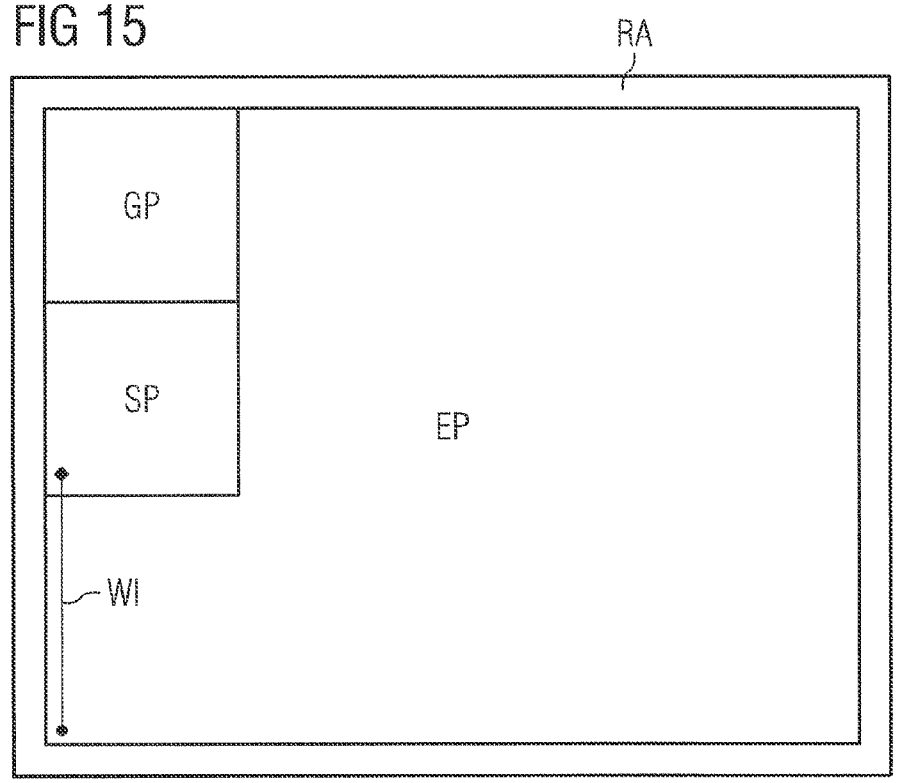
FIG. 15 illustrates in a diagram one embodiment of an arrangement of a load electrode zone, a control electrode zone, a component electrode zone, an edge termination region and an insulated resistance track of the component in an integrated semiconductor transistor circuit.

FIG. 15 illustrates in a diagram an exemplary embodiment of an arrangement in a semiconductor body of an integrated semiconductor transistor circuit. FIG. 15 has a load electrode zone (emitter pad EP), a control electrode zone (gate pad GP), a component electrode zone (sensor pad SP), an edge termination region RA and an insulated resistance track WI. The control electrode zone GP and the component electrode zone SP can serve as bonding pads, for example, in order to be able to produce the connection illustrated e.g., in FIG. 8 between the resistance component $R_{GE}$ and the control connection G (cf. circuit nodes 1 and 2), with the aid of a bonding wire 10.

In accordance with FIG. 15, the load electrode zone EP covers the largest region of the rectangularly shaped area of the semiconductor body of the integrated semiconductor transistor circuit and is terminated by the edge termination region RA. Arranged in one corner of the semiconductor body is a control electrode zone GP and, adjoining the latter, a component electrode zone SP embodied in the same size. Between the component electrode zone SP and a further corner of the semiconductor body, the insulated resistance track WI extends parallel to and along the edge termination region RA.

The insulated resistance track WI is electrically connected to the component electrode zone SP on one side and is electrically connected to the load electrode zone EP on the other side. The electrical contact between the insulated resistance track WI and the component electrode zone SP is identified by a rhombus in FIG. 15 and the electrical contact between the insulated resistance track WI and the load electrode zone EP is identified by a circle.

In this case, the control electrode zone GP and the component electrode zone SP can optionally also first be electrically connected to one another in a separate production process in order to enable a preceding test of the blocking properties of the semiconductor transistor, the test being uninfluenced by the resistance track WI. As an alternative to this, as described further above but not explicitly illustrated here, it is also possible to form the electrical connection between the resistance track WI and the load electrode zone EP in a separate production step. The same also applies to all of the subsequently illustrated exemplary embodiments in accordance with FIG. 16 to FIG. 26, in which, for the sake of clarity, an integrated gate resistor is not illustrated either.

Figure 16:
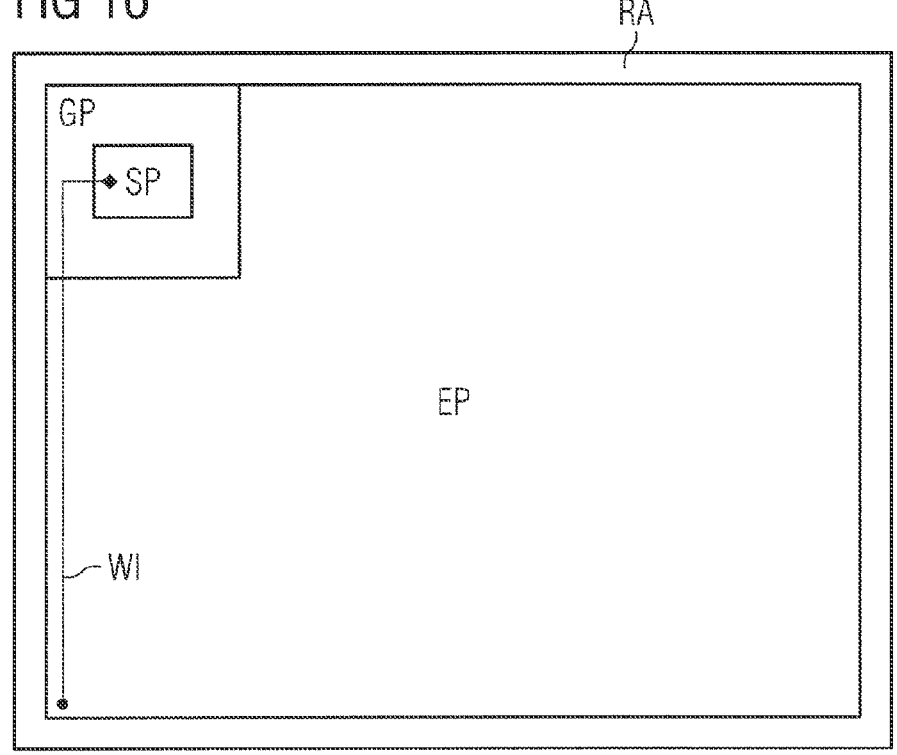
FIG. 16 illustrates in a diagram one embodiment of an arrangement of a load electrode zone, a control electrode zone, a component electrode zone, an edge termination region and an insulated resistance track of a component in an integrated semiconductor transistor circuit.

FIG. 16 illustrates in a diagram a further exemplary embodiment of an arrangement of an integrated semiconductor transistor circuit which includes the same elements and the same interconnection of the elements among one another as the exemplary embodiment in accordance with FIG. 15. In contrast to FIG. 15, however, the component electrode zone SP is in this case arranged on the control electrode zone GP and the insulated resistance track WI extends from the component electrode zone SP in a direction of the edge termination region RA and from there further along and parallel to the edge termination region RA as far as a further corner of the semiconductor body.

FIG. 17 illustrates in a diagram a further exemplary embodiment of an arrangement of an integrated semiconductor transistor circuit which has the same elements and the same interconnection of the elements among one another as the exemplary embodiment in accordance with FIG. 16. In contrast to FIG. 16, the insulated resistance track WI firstly likewise extends from the component electrode zone SP in a direction of the edge termination region RA and from there further along and parallel to the edge termination region RA, but after leaving the control electrode zone GP is embodied in meandering fashion along an edge of the control electrode zone GP. In this case, the electrical contact between the insulated resistance track WI and the load electrode zone EP is embodied near to the control electrode zone GP and at the edge with respect to the edge termination region RA.

The resistance value of the resistance track and the thermal coupling to specific regions of the integrated semiconductor circuit can be defined by the different exemplary embodiments of the resistance track WI with regard to the length and shaping of the resistance track that are illustrated in FIG. 15 to FIG. 17 and also in the subsequent figures.

FIG. 18 illustrates in a diagram a further exemplary embodiment of an arrangement of an integrated semiconductor transistor circuit which has the same elements and the same interconnection of the elements among one another as the exemplary embodiments in accordance with FIG. 16 and FIG. 17. In accordance with FIG. 18, the resistance track WI is once again formed as an elongated resistance track which firstly likewise extends from the component electrode zone SP in a direction of the edge termination region RA and from there further along and parallel to the edge termination region RA, but after leaving the control electrode zone GP extends further along the two edges of the control electrode zone GP which face the load electrode zone EP, as far as the edge region RA.

Figure 19:
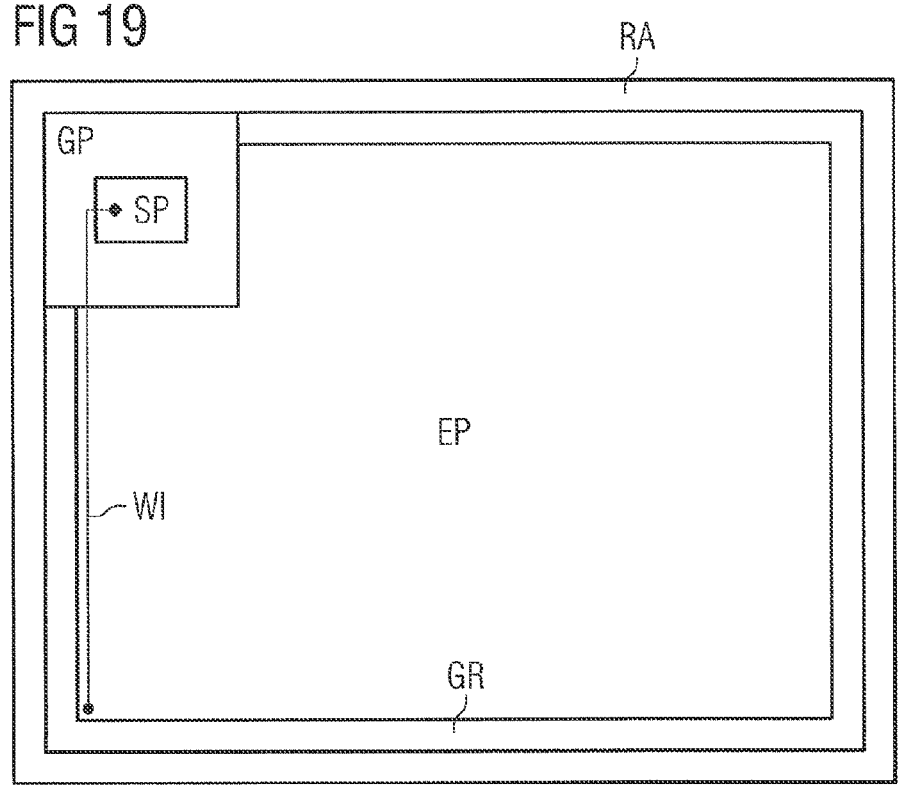
FIG. 19 illustrates in a diagram one embodiment of an arrangement of a load electrode zone, a control electrode zone, a component electrode zone, an edge termination region, a control electrode edge region and an insulated resistance track of a component in an integrated semiconductor transistor circuit.

FIG. 19 illustrates in a diagram an exemplary embodiment of an arrangement of a load electrode zone EP, a control electrode zone GP, a component electrode zone SP, an edge termination region RA, a control electrode edge region GR and an insulated resistance track WI in an integrated semiconductor transistor circuit. In contrast to FIG. 16, in this case the control electrode edge region GR additionally extends between the edge termination region RA and the load electrode zone EP proceeding from the control electrode zone GP. In this case, the insulated resistance track WI extends from the component electrode zone SP in a direction of the control electrode edge region GR and from there further along and parallel to the control electrode edge region GR as far as a further corner of the semiconductor body of the integrated circuit.

Figure 20:
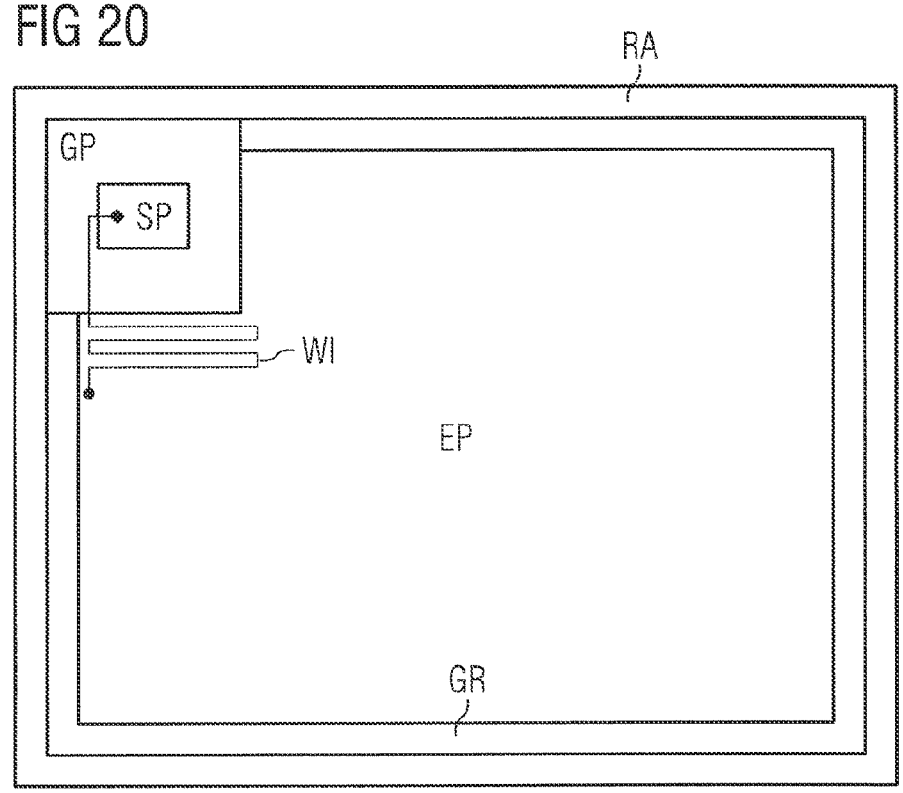
FIG. 20 illustrates in a diagram one embodiment of the arrangement of a load electrode zone, a control electrode zone, a component electrode zone, an edge termination region, a control electrode edge region and an insulated resistance track of a component in an integrated semiconductor transistor circuit.

FIG. 20 illustrates in a diagram a further exemplary embodiment of an arrangement of an integrated semiconductor transistor circuit which has the same elements and the same interconnection of the elements among one another as the exemplary embodiment in accordance with FIG. 19. The insulated resistance track WI firstly extends from the component electrode zone SP parallel to the edge region RA via the control electrode zone GP in a direction of the load electrode zone EP and, after leaving the control electrode zone GP, is embodied in meandering fashion on the load electrode zone EP along the edge of the control electrode zone GP. In this case, the electrical contact between the insulated resistance track WI and the load electrode zone EP is formed near to the control electrode zone GP and at the edge with respect to the control electrode edge region GR.

Figure 21:
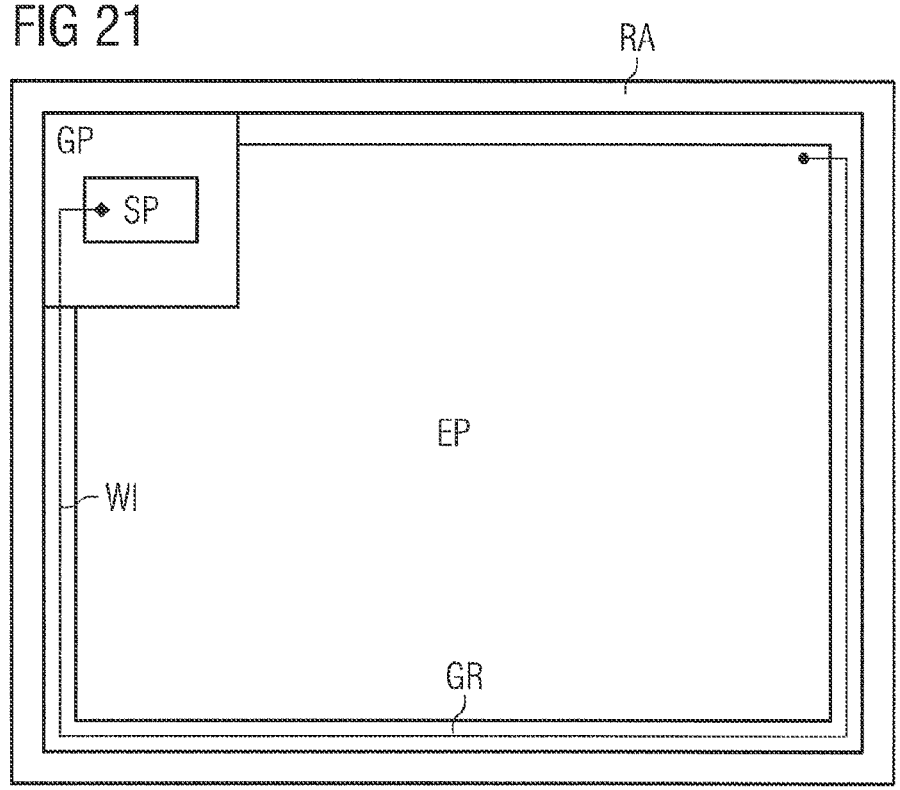
FIG. 21 illustrates in a diagram one embodiment of an arrangement of a load electrode zone, a control electrode zone, a component electrode zone, an edge termination region, a control electrode edge region and an insulated resistance track of a component in an integrated semiconductor transistor circuit.

FIG. 21 illustrates in a diagram a further exemplary embodiment of an arrangement of an integrated semiconductor transistor circuit which has the same elements and the same interconnection of the elements among one another as the exemplary embodiments in accordance with FIG. 19 and FIG. 20. In accordance with FIG. 21, the insulated resistance track WI firstly extends from the component electrode zone SP via the control electrode zone GP to the edge region RA and from there parallel to the edge region RA in a direction of the control electrode edge region GR. After leaving the control electrode zone GP, the resistance track WI, running under the control electrode edge region GR, extends along three edges of the load electrode zone EP until the resistance track WI is led back to the load electrode zone EP in order to make contact with the latter.

Figure 22:
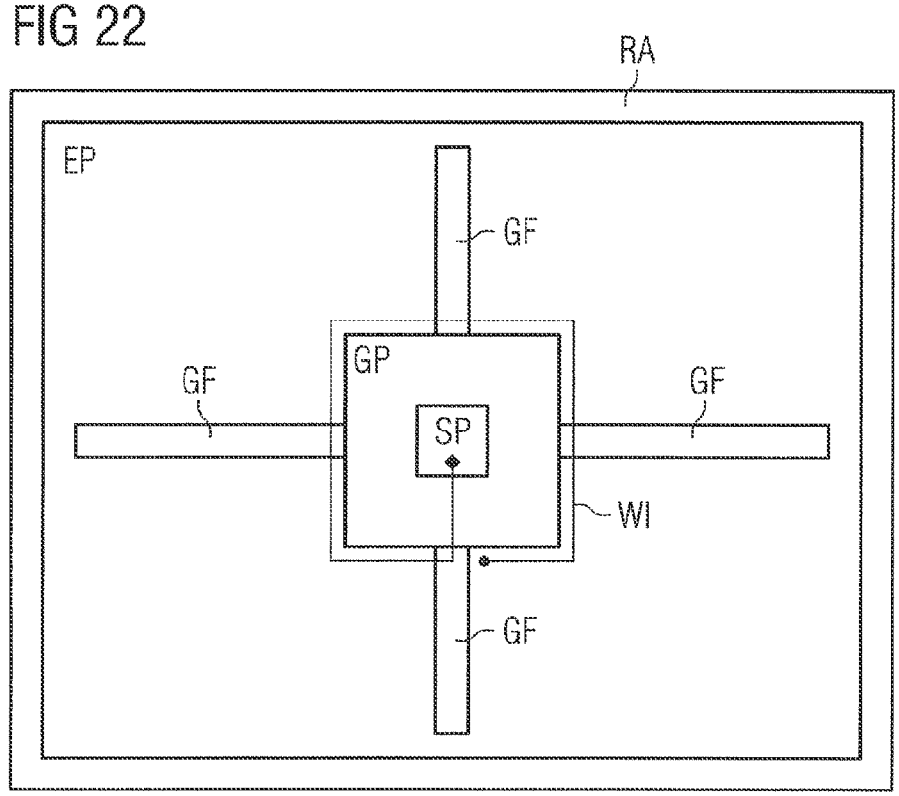
FIG. 22 illustrates in a diagram one embodiment of an arrangement of a load electrode zone, a control electrode zone with control electrode fingers, a component electrode zone, an edge termination region and an insulated resistance track of a component in an integrated semiconductor transistor circuit.

FIG. 22 illustrates in a diagram an exemplary embodiment of an arrangement of a load electrode zone EP, a control electrode zone GP with four control electrode fingers GF, a component electrode zone SP, an edge termination region RA and an insulated resistance track WI in an integrated semiconductor transistor circuit. In accordance with FIG. 20, the control electrode zone GP is arranged centrally on the area of the load electrode zone EP and the component electrode zone SP is in turn arranged centrally on the area of the control electrode zone GP. Four control electrode fingers GF extend in each case from the center of each edge of the control electrode zone GP in a direction of the edge termination region RA. The resistance track WI runs from the center of an edge of the component electrode zone SP via the control electrode zone GP to one of the control electrode fingers GF and from there along and parallel to the four edges of the control electrode zone GP across the control electrode fingers GF and the load electrode zone EP. Where the resistance track reaches the first control electrode finger GF again, that is where the contact with the load electrode zone EP is embodied.

The central arrangement of component electrode zone SP, control electrode zone GP and resistance track WI on the load electrode zone EP results in a thermal coupling of the resistance track WI to the region between control electrode zone GP and load electrode zone EP in the center of the semiconductor circuit. This ensures that the semiconductor temperature or junction temperature of the semiconductor is determined at the location of maximum evolution of heat. Typically, the heat that arises in an integrated semiconductor circuit is dissipated toward the edge of the component and decreases on this path, such that a resistance track WI that is not arranged centrally cannot exhibit the maximum temperature that occurs.

Figure 23:
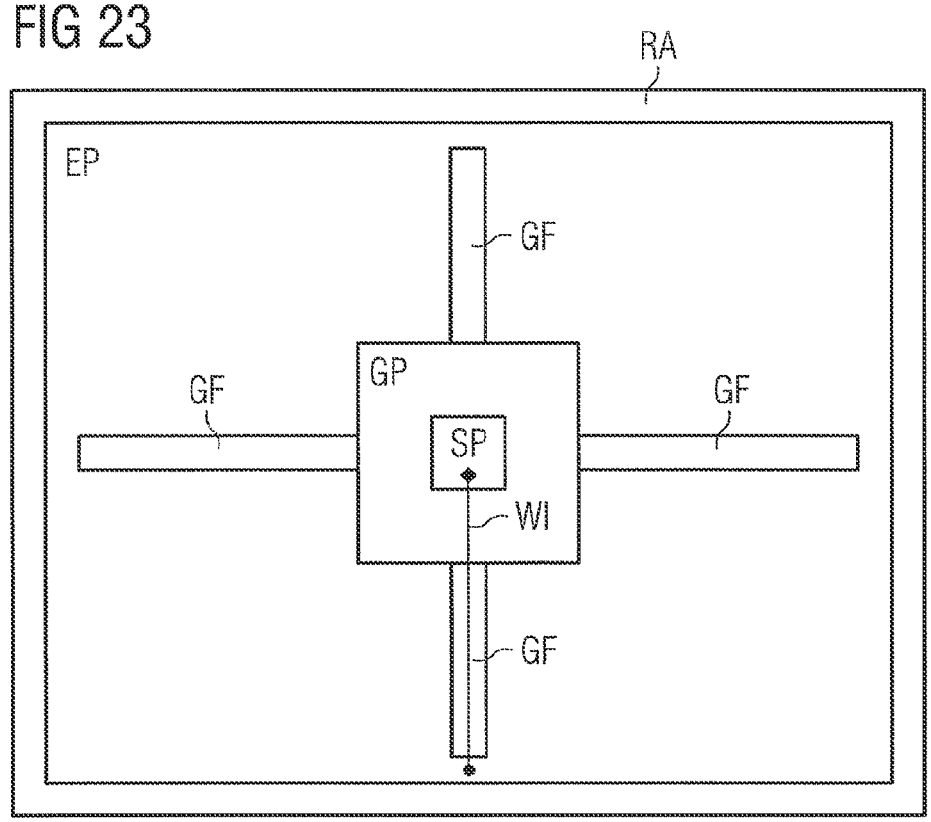
FIG. 23 illustrates in a diagram one embodiment of an arrangement of a load electrode zone, a control electrode zone with control electrode fingers, a component electrode zone, an edge termination region and an insulated resistance track of a component in an integrated semiconductor transistor circuit.

FIG. 23 illustrates in a diagram an exemplary embodiment of an arrangement of an integrated semiconductor transistor circuit which has the same elements and the same interconnection of the elements among one another as the exemplary embodiment in accordance with FIG. 20. In contrast to FIG. 20, the resistance track WI extends from the center of an edge of the component electrode zone SP via the control electrode zone GP to one of the control electrode fingers GF and from there along the center of and below the control electrode finger GF as far as the electrical contact-making on the load electrode zone EP near the edge termination region RA. Since, in accordance with FIG. 23, the component electrode zone SP is arranged centrally in the control electrode zone GP and the resistance track WI is formed under the control electrode finger GF, no additional area requirement results from the integration of the resistance track WI into the semiconductor component.

Figure 24:
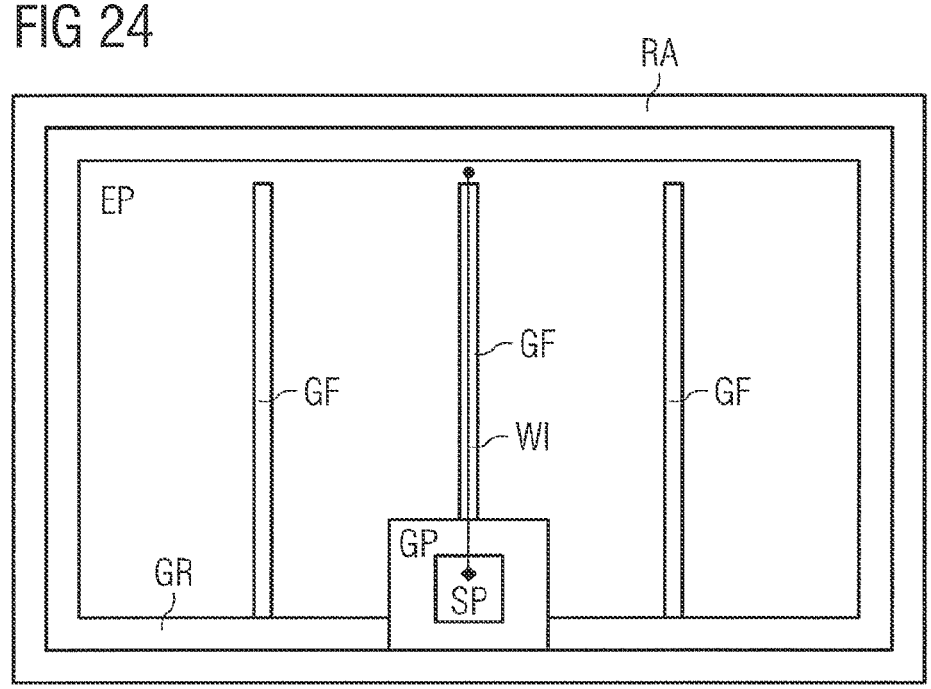
FIG. 24 illustrates in a diagram one embodiment of an arrangement of a load electrode zone, a control electrode zone with control electrode fingers, a control electrode edge region, an edge termination region, a component electrode zone and an insulated resistance track of a component in an integrated semiconductor transistor circuit.

FIG. 24 illustrates in a diagram an exemplary embodiment of an arrangement having a load electrode zone EP, a control electrode zone GP, three control electrode fingers GF, a control electrode edge region GR, a component electrode zone SP, an edge termination region RA and an insulated resistance track WI in an integrated semiconductor transistor circuit. In accordance with FIG. 24, proceeding from the control electrode zone GP arranged centrally in an edge region of the load electrode zone EP, in this case the control electrode edge region GR extends circumferentially between the edge termination region RA and the load electrode zone EP. Furthermore, proceeding from the same edge region, two control electrode fingers GF, one respectively on each side of the control electrode zone GP, extend over almost the entire area of the load electrode zone EP in a direction of the opposite control electrode edge region GR.

A third control electrode finger GF, proceeding from an edge of the control electrode zone GP which faces the center of the semiconductor body, extends over almost the entire area of the load electrode zone EP in a direction of the opposite control electrode edge region GR. In this case, the insulated resistance track WI extends centrally from an edge of the component electrode zone SP in a direction of the opposite control electrode edge region GR and thus along the center of and below the third control electrode finger GF.

In this way the resistance track is thermally coupled to a region of the integrated semiconductor which runs centrally on the area of the load electrode zone EP from one side of the semiconductor body to the other. In this case, the heating of the elongated resistance track WI corresponds to an average value of the temperature profile as runs through the center of the arrangement of the integrated semiconductor circuit. Since, in accordance with FIG. 24, the component electrode zone SP is arranged centrally in the control electrode zone GP and the resistance track WI is formed under a control electrode finger GF, no additional area requirement results from the integration of the resistance track WI into the semiconductor component.

Figure 25:
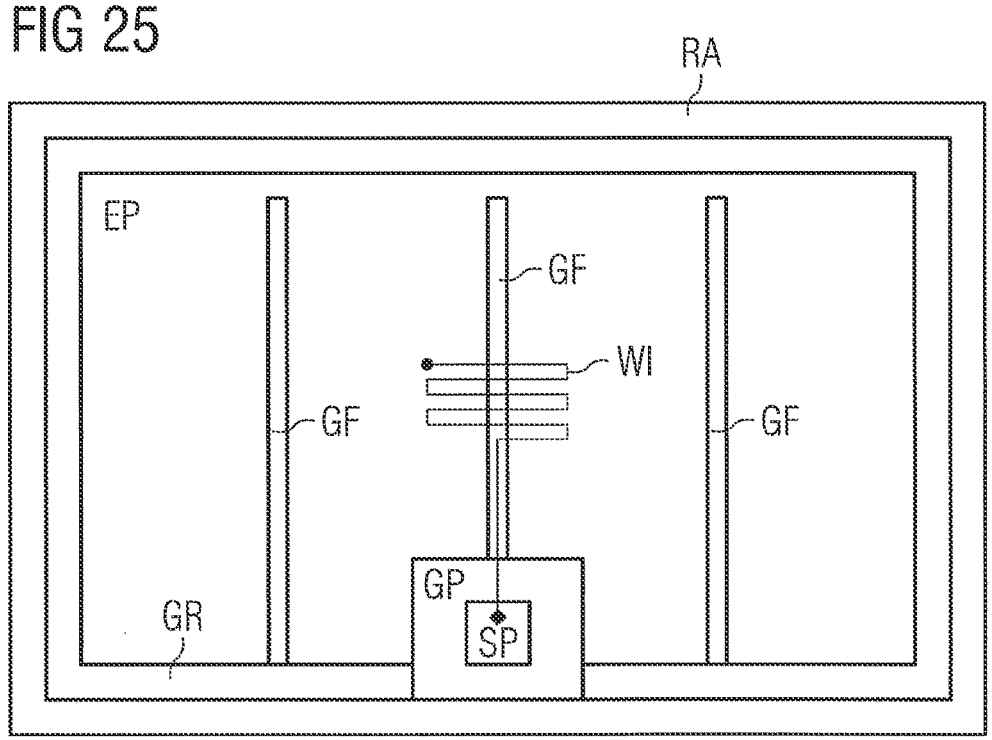
FIG. 25 illustrates in a diagram one embodiment of an arrangement of a load electrode zone, a control electrode zone with control electrode fingers, a control electrode edge region, an edge termination region, a component electrode zone and an insulated resistance track of a component in an integrated semiconductor transistor circuit.

FIG. 25 illustrates in a diagram a further exemplary embodiment of an arrangement of an integrated semiconductor transistor circuit which has the same elements and the same interconnection of the elements among one another as the exemplary embodiment in accordance with FIG. 24. In contrast to FIG. 24, the resistance track WI does not extend along the entire length of the third control electrode finger GF, but rather forms a meandering structure in the center of the area of the load electrode zone EP, which structure is electrically connected to the load electrode zone EP at its end. In this way, the largest proportion of the resistance track WI in turn experiences a thermal coupling to the central region of the area of the load electrode zone EP, in which the highest temperature typically prevails during the operation of a power semiconductor.

Figure 26:
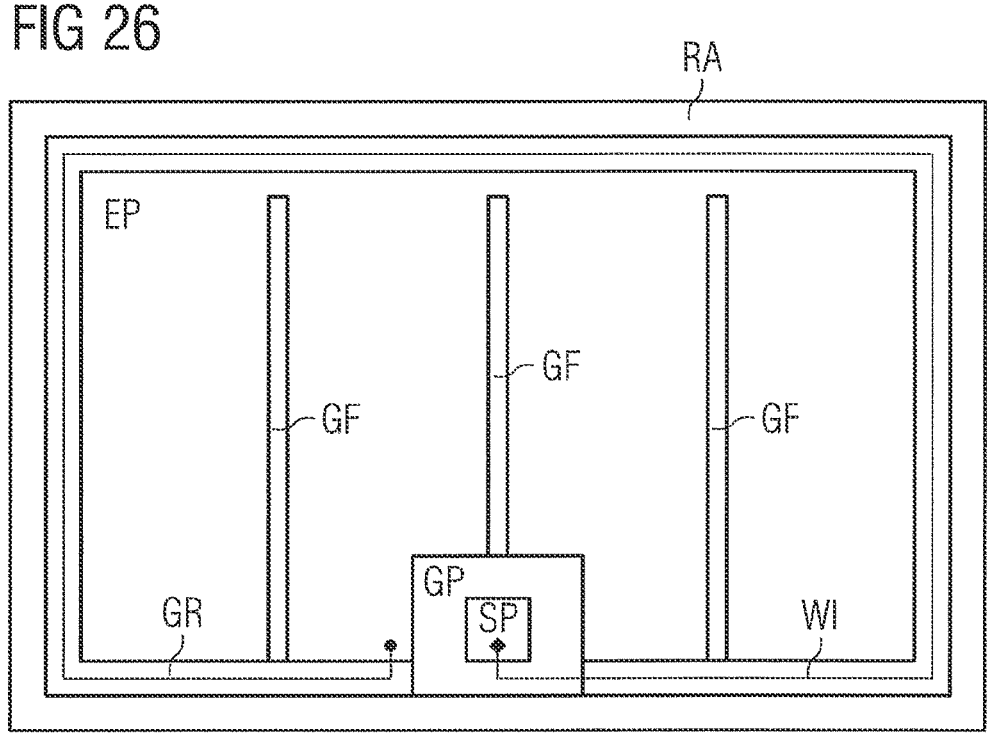
FIG. 26 illustrates in a diagram one embodiment of an arrangement of a load electrode zone, a control electrode zone with control electrode fingers, a control electrode edge region, an edge termination region, a component electrode zone and an insulated resistance track of a component in an integrated semiconductor transistor circuit.

FIG. 26 illustrates in a diagram a further exemplary embodiment of an arrangement of an integrated semiconductor transistor circuit which has the same elements and the same interconnection of the elements among one another as the exemplary embodiments in accordance with FIG. 24 and FIG. 25. In contrast to FIG. 24 and FIG. 25, the insulated resistance track WI extends from the center of an edge of the component electrode zone SP across the control electrode zone GP in a direction of the control electrode edge region GR arranged closest and then along the entire circumference of the control electrode edge region GR under the latter. Shortly before the control electrode edge region GR meets the control electrode zone GP again, the insulated resistance track WI is electrically connected to the load electrode zone EP by a corresponding contact-connection. Since, in accordance with FIG. 26, the component electrode zone SP is arranged centrally in the control electrode zone GP and the resistance track WI is formed under the control electrode edge region GR, no additional area requirement results from the integration of the resistance track WI into the semiconductor component.

Figure 27A:
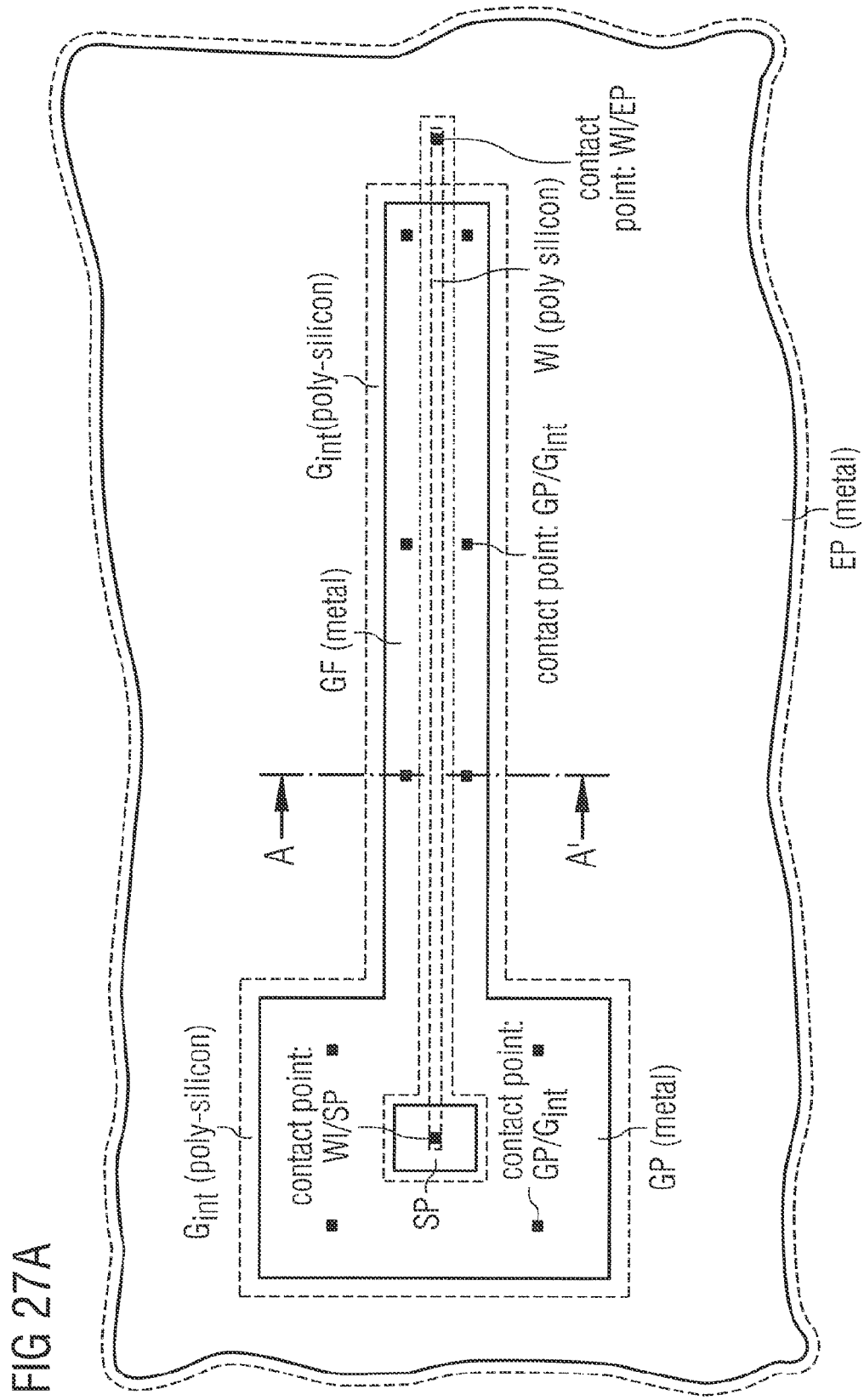
FIG. 27 illustrates in a diagram one embodiment of an arrangement of a load electrode zone, a control electrode zone with a control electrode finger, a component electrode zone and an insulated resistance track of a component in an integrated semiconductor transistor circuit.

FIG. 27 illustrates in a detailed diagram on the basis of the example of an IGBT power semiconductor transistor a further exemplary embodiment of an arrangement of an emitter electrode zone EP, a gate electrode zone GP with a gate electrode finger GF, a component electrode zone SP and an insulated resistance track WI in an integrated semiconductor transistor circuit. The arrangement furthermore includes an emitter metal with a gate polysilicon arranged thereon, and also a multiplicity of electrical contact-connections and a component polysilicon associated with the component structure. In accordance with FIG. 27, the semiconductor structure including gate electrode zone GP, gate electrode finger GF, component electrode zone SP and insulated resistance track WI is arranged centrally on a large-area emitter electrode zone EP, which is not illustrated in its entirety. In this case, the component electrode zone SP is once again arranged centrally on the gate electrode zone GP and is electrically connected to the component polysilicon by a contact-connection.

In accordance with FIG. 27, the gate electrode zone GP is electrically connected to the gate polysilicon by four contact-connections. The gate electrode finger GF extends centrally from an edge of the gate electrode zone GP and is electrically connected to the gate polysilicon by six contact-connections. The insulated resistance track WI extends in the same direction in a manner running in the center and under the gate electrode finger GF, and in terms of its length the resistance track is formed beyond the end of the gate electrode finger GF. At this end, the polysilicon of the resistance track WI is electrically connected to the emitter electrode zone EP by a contact-connection. In this way, the resistance track connected between gate and emitter of the IGBT runs centrally between the semiconductor structure of the gate electrode and the semiconductor structure of the emitter electrode, whereby an optimum thermal coupling to the junction region of the power semiconductor is obtained. Furthermore this arrangement of the resistance track WI once again does not necessitate additional area requirement for the temperature-dependent component in the semiconductor body of the power semiconductor.

The exemplary embodiments illustrated in FIG. 15 to FIG. 27 all have in each case a component electrode zone SP and a control electrode zone GP. The electrical contact-connection of the resistance track WI to the component electrode zone SP at one end and to the load electrode zone EP at the other end of the resistance track WI is in this case implemented in a first step, for example, in the production process. The electrical contact-connection between the component electrode zone SP and the control electrode zone GP can in this case be implemented in a second process of the production process in order to enable a preceding test of the electrical properties of the power semiconductor, which test is carried out without being influenced by the power semiconductor being connected up to the resistance track WI. If such a preceding test of the power semiconductor is not desired, the one end of the resistance track WI can also be connected directly to the control electrode zone GP in a single production step, whereby a separately embodied component electrode zone SP can additionally be obviated.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor chip comprising:
a semiconductor body; and
a power semiconductor component integrated therein, wherein the power semiconductor component comprises:
a load electrode zone arranged on a first surface of the semiconductor body;
a control electrode zone arranged on the first surface, the control electrode zone being electrically insulated from the load electrode zone;
a resistance track arranged on the load electrode zone and the control electrode zone, the resistance track ensuring an electrical connection between the load electrode zone and the control electrode zone;
a component electrode zone arranged on the first surface, the component electrode zone being electrically insulated from the load electrode zone and from the control electrode zone;
a bonding connection that connects the control electrode zone to the component electrode zone or the load electrode zone to the component electrode zone with resistance, wherein the resistance track connects the component electrode zone to the load electrode zone or the component electrode zone to the control electrode zone; and
an edge termination surrounding the electrode zones, wherein the resistance track is arranged along the edge termination.

2. The semiconductor chip of claim 1, further comprising:
a component electrode zone arranged on the first surface, the component electrode zone being electrically insulated from the load electrode zone and from the control electrode zone; and
a metallization layer that connects the control electrode zone to the component electrode zone or the load electrode zone to the component electrode zone with low resistance, wherein the resistance track connects the component electrode zone to the load electrode zone or the component electrode zone to the control electrode zone.

3. The semiconductor chip of claim 1, wherein the resistance track is formed in meandering fashion.

4. The semiconductor chip of claim 1, further comprising at least one control electrode finger connected to the control electrode zone.

5. The semiconductor chip of claim 4, wherein the control electrode zone surrounds the component electrode zone;
the control electrode finger is arranged at least partly on the load electrode zone; and
the resistance track is arranged at least partly between the load electrode zone and the control electrode finger.

6. The semiconductor chip of claim 1, wherein the resistance track extends parallel to and along at least one edge of the control electrode or load electrode zone.

7. A method for producing an integrated semiconductor circuit having at least one power semiconductor component and at least one resistance component, the method comprising:
providing the power semiconductor component;
fabricating the resistance component with a temperature-dependent resistance characteristic curve having two connecting lines;
carrying out a functional test on the power semiconductor component to measure the internal temperature; and
connecting one of the two connecting lines of the resistance component to a control electrode or a load electrode of the power semiconductor component;
producing a bonding connection between a component electrode zone connected to the resistance component and the control electrode; and
calibrating the resistance value of the resistance component with an electrical calibrating device.

8. The method of claim 7, wherein connecting the resistance component comprises:
producing a bonding connection between a component electrode zone connected to the resistance component and the load electrode.

* * * * *